US010714552B2

(12) United States Patent
Matsukizono

(10) Patent No.: US 10,714,552 B2
(45) Date of Patent: Jul. 14, 2020

(54) ACTIVE MATRIX SUBSTRATE HAVING PLURALITY OF CIRCUIT THIN FILM TRANSISTORS AND PIXEL THIN FILM TRANSISTORS

(71) Applicant: Sharp Kabushiki Kaisha, Sakai, Osaka (JP)

(72) Inventor: Hiroshi Matsukizono, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 16 days.

(21) Appl. No.: 16/330,120

(22) PCT Filed: Aug. 28, 2017

(86) PCT No.: PCT/JP2017/030782
§ 371 (c)(1),
(2) Date: Mar. 4, 2019

(87) PCT Pub. No.: WO2018/043426
PCT Pub. Date: Aug. 3, 2018

(65) Prior Publication Data
US 2019/0237489 A1    Aug. 1, 2019

(30) Foreign Application Priority Data

Sep. 5, 2016 (JP) .................................. 2016-172699

(51) Int. Cl.
*H01L 29/12* (2006.01)
*H01L 21/00* (2006.01)
(Continued)

(52) U.S. Cl.
CPC .......... *H01L 27/3248* (2013.01); *G02F 1/133* (2013.01); *G02F 1/1343* (2013.01);
(Continued)

(58) Field of Classification Search
CPC ............. H01L 29/4908; H01L 27/1225; H01L 27/3262; H01L 27/3248; H01L 27/7869; H01L 27/3276
See application file for complete search history.

(56) References Cited

U.S. PATENT DOCUMENTS 8,575,614 B2 * 11/2013 Makita .................... H01L 27/12
257/71
2002/0070382 A1 * 6/2002 Yamazaki ............. H01L 27/124
257/72
(Continued)

FOREIGN PATENT DOCUMENTS

JP  2003-050388 A  2/2003
JP  2006-119404 A  5/2006
(Continued)

OTHER PUBLICATIONS

Official Communication issued in International Patent Application No. PCT/JP2017/030782, dated Nov. 7, 2017.
(Continued)

*Primary Examiner* — Alonzo Chambliss
(74) *Attorney, Agent, or Firm* — Keating & Bennett, LLP

(57) ABSTRACT

An active matrix substrate (1001) has multiple pixel areas. At least one pixel area includes a pixel TFT (20), a pixel electrode (15), a first circuit TFT (10), and drive circuit wiring lines (L1 to L3) that are connected to the first circuit TFT. The pixel TFT (20) and the first circuit TFT (10) are oxide semiconductor TFTs. The pixel electrode (15) is formed from an upper transparent conductive film. The drive circuit wiring line includes a transparent wiring line portion (L1 and L2) that is formed from a lower transparent conductive film which is positioned closer to a substrate 1 than the upper transparent conductive film. At least one of a source electrode (8) and a drain electrode (9) of the first
(Continued)

circuit TFT (10) is formed from the lower transparent conductive film.

17 Claims, 10 Drawing Sheets

(51) Int. Cl.
| | |
|---|---|
| *H01L 27/32* | (2006.01) |
| *G02F 1/1368* | (2006.01) |
| *G02F 1/1343* | (2006.01) |
| *H01L 27/12* | (2006.01) |
| *G02F 1/133* | (2006.01) |
| *G09F 9/30* | (2006.01) |
| *G09F 9/00* | (2006.01) |
| *H01L 29/49* | (2006.01) |
| *G02F 1/1362* | (2006.01) |
| *H01L 29/786* | (2006.01) |

(52) U.S. Cl.
CPC ...... *G02F 1/1368* (2013.01); *G02F 1/136277* (2013.01); *G02F 1/136286* (2013.01); *G09F 9/00* (2013.01); *G09F 9/30* (2013.01); *H01L 27/127* (2013.01); *H01L 27/1225* (2013.01); *H01L 27/1248* (2013.01); *H01L 27/1251* (2013.01); *H01L 27/3262* (2013.01); *H01L 27/3276* (2013.01); *H01L 29/4908* (2013.01); *H01L 29/7869* (2013.01)

(56) References Cited

U.S. PATENT DOCUMENTS

| | | | |
|---|---|---|---|
| 2003/0122121 A1* | 7/2003 | Yamazaki | H01L 29/42384 257/40 |
| 2003/0201439 A1* | 10/2003 | Yamazaki | H01L 29/78645 257/59 |
| 2004/0183931 A1* | 9/2004 | Yamazaki | H01L 27/1255 348/294 |
| 2005/0067618 A1* | 3/2005 | Nakajima | H01L 29/42384 257/59 |
| 2008/0024416 A1 | 1/2008 | Onogi et al. | |
| 2008/0225024 A1 | 9/2008 | Ito | |
| 2009/0323005 A1 | 12/2009 | Ota | |
| 2011/0140108 A1 | 6/2011 | Kimura et al. | |
| 2012/0068182 A1* | 3/2012 | Yamanaka | H01L 27/12 257/59 |
| 2012/0138922 A1 | 6/2012 | Yamazaki et al. | |
| 2013/0001583 A1* | 1/2013 | Yamazaki | G02F 1/13454 257/72 |
| 2013/0320334 A1 | 12/2013 | Yamazaki et al. | |
| 2014/0286076 A1 | 9/2014 | Aoki et al. | |
| 2015/0108467 A1 | 4/2015 | Moriguchi et al. | |
| 2015/0293546 A1 | 10/2015 | Tanaka et al. | |
| 2016/0133685 A1* | 5/2016 | Yamazaki | H01L 27/3279 257/89 |
| 2016/0190184 A1 | 6/2016 | Imamura et al. | |
| 2017/0047038 A1 | 2/2017 | Noma et al. | |

FOREIGN PATENT DOCUMENTS

| | | |
|---|---|---|
| JP | 2008-032899 A | 2/2008 |
| JP | 2008-225036 A | 9/2008 |
| JP | 2010-008758 A | 1/2010 |
| JP | 2012-134475 A | 7/2012 |
| JP | 2013-225620 A | 10/2013 |
| JP | 2014-003619 A | 1/2014 |
| JP | 2014-7399 A | 1/2014 |
| JP | 2014-209727 A | 11/2014 |
| JP | 2016-122683 A | 7/2016 |
| WO | 2012/086513 A1 | 6/2012 |
| WO | 2014/069529 A1 | 5/2014 |
| WO | 2015/166857 A1 | 11/2015 |

OTHER PUBLICATIONS

Tanaka et al., "FFD (Free Form Display) Technology", Sharp Technical Journal, No. 108, Mar. 2015, pp. 8-11.

\* cited by examiner

FIG. 3
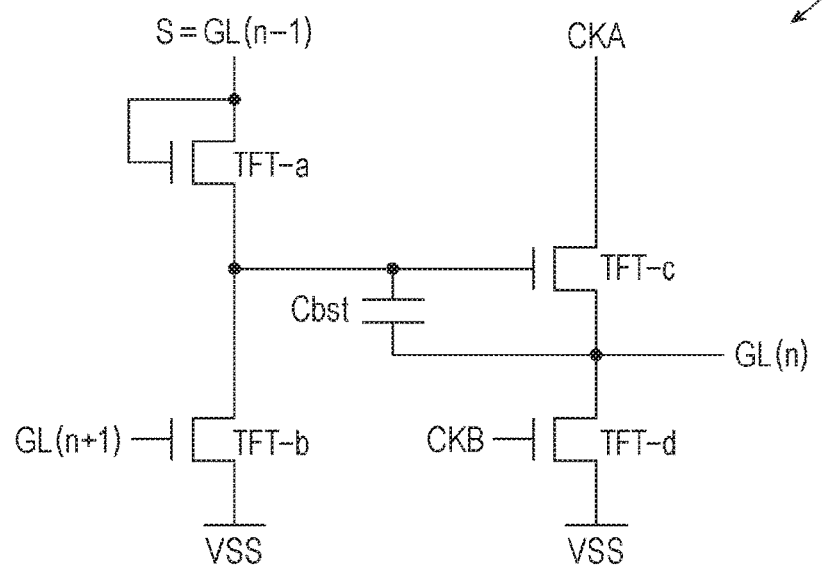
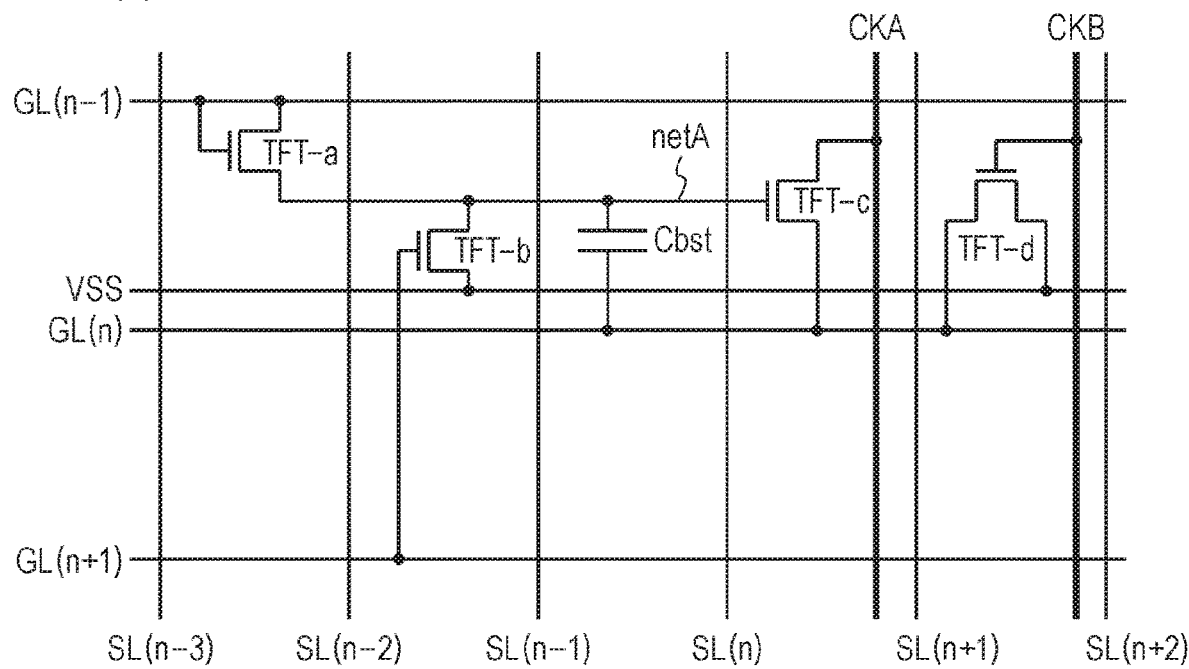

FIG. 4
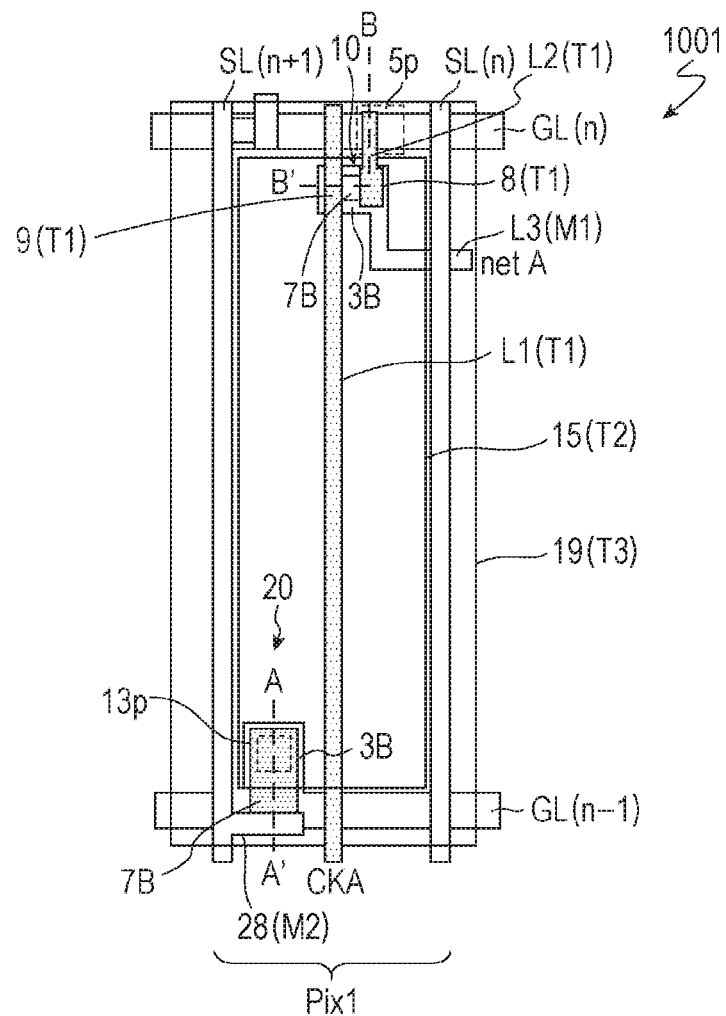
(a)
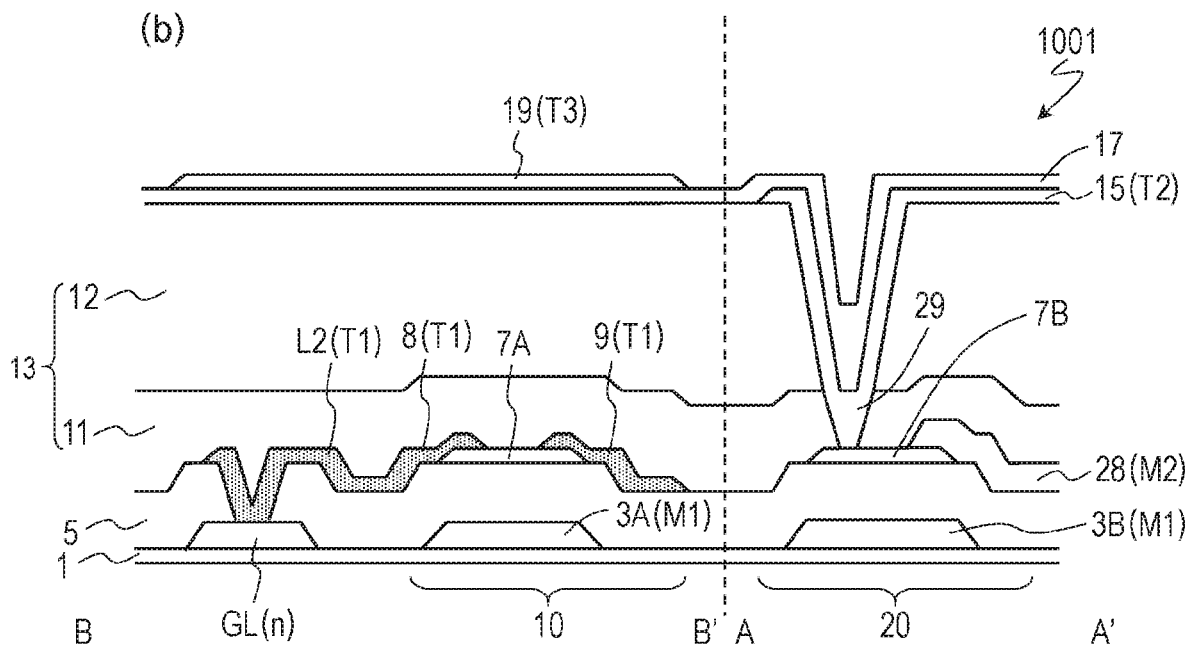
(b)

FIG. 7
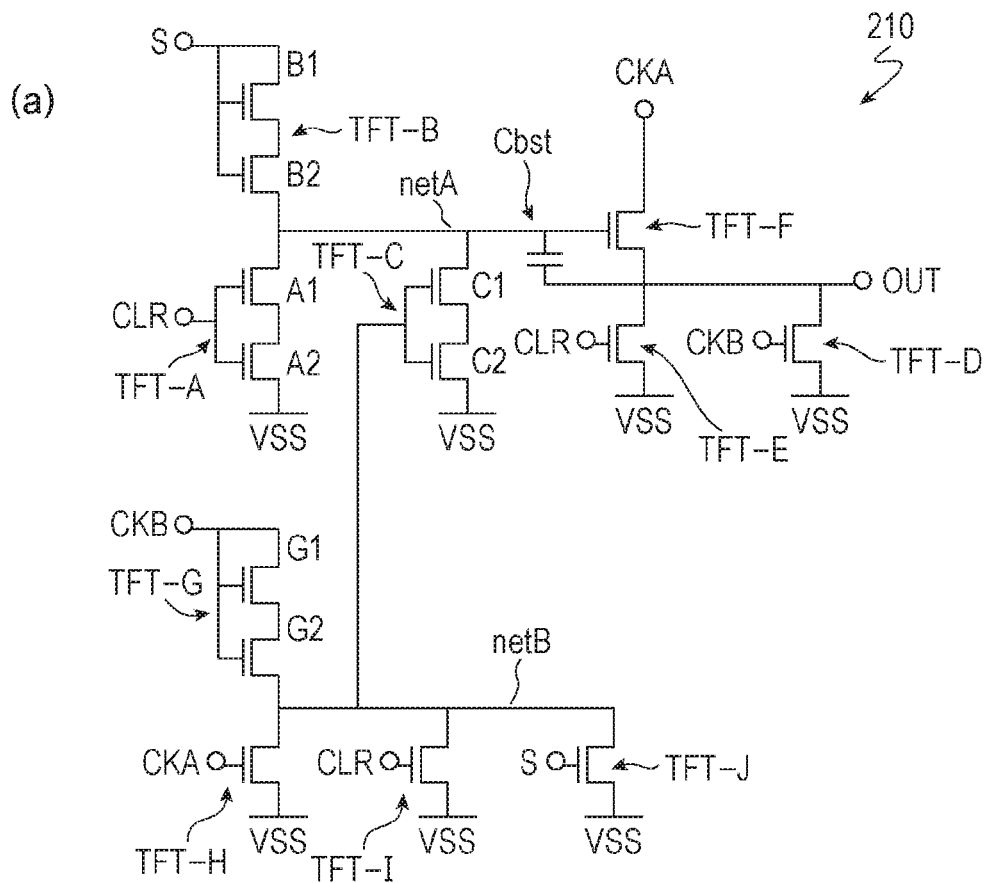
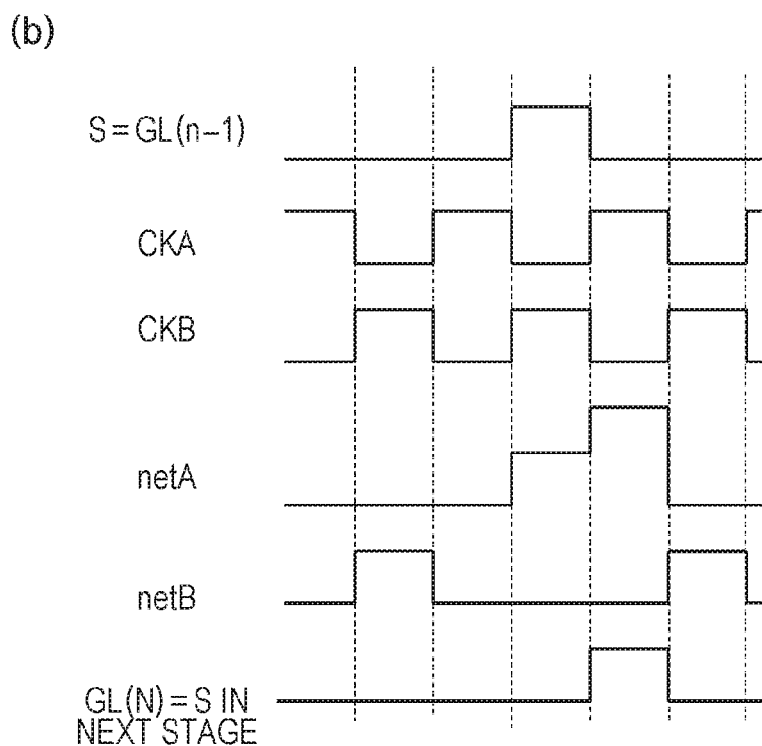

FIG. 11
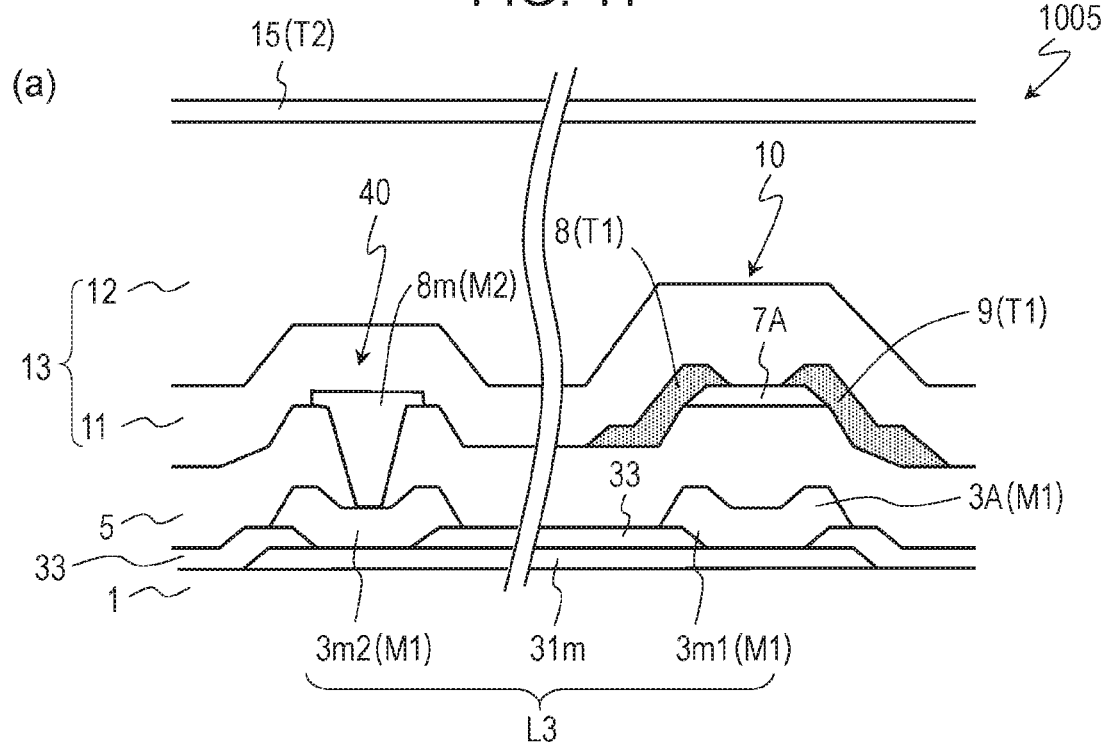
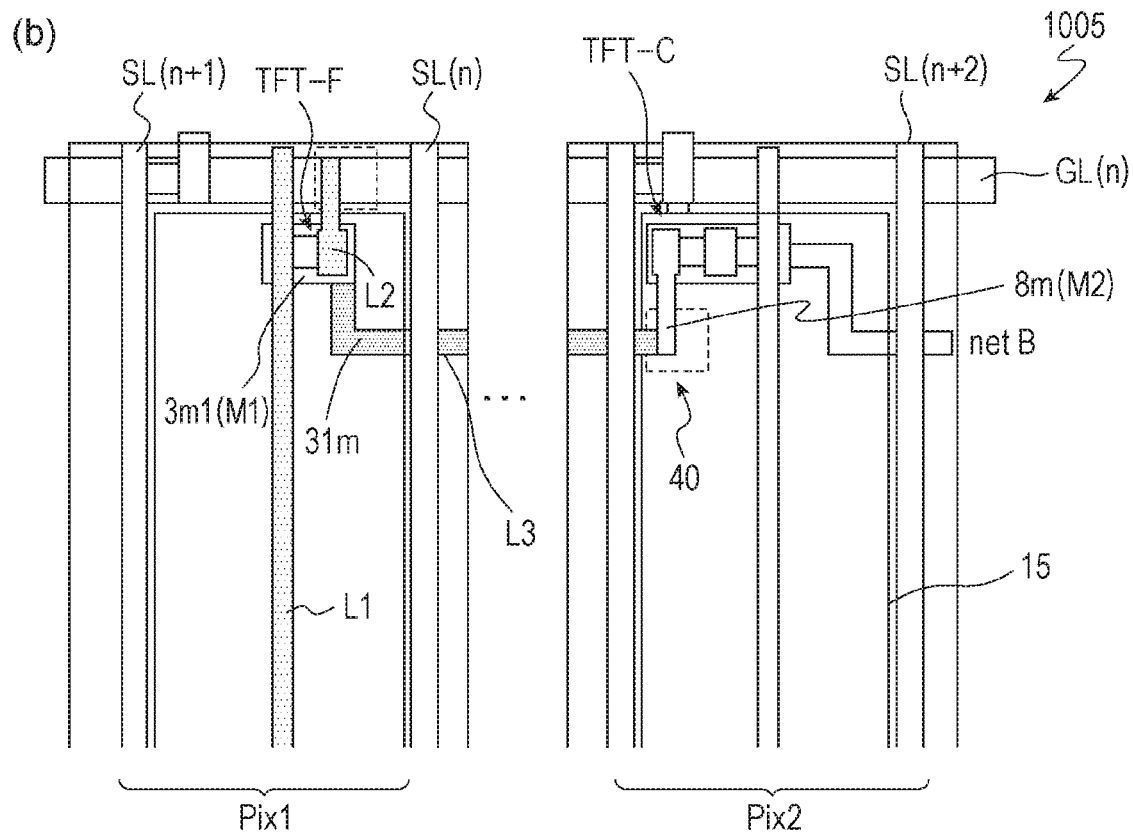

ACTIVE MATRIX SUBSTRATE HAVING PLURALITY OF CIRCUIT THIN FILM TRANSISTORS AND PIXEL THIN FILM TRANSISTORS

TECHNICAL FIELD

The present invention relates to an active matrix substrate and a method for manufacturing the active matrix substrate.

BACKGROUND ART

An active matrix substrate that is used in a liquid crystal display device or the like includes a switching element, such as a Thin Film Transistor (hereinafter referred to as "TFT"), for every pixel. As this switching element, a TFT of which an active layer is an amorphous silicon film (hereinafter referred to as "amorphous silicon TFT"), or a TFT of which an active layer is a polycrystalline silicon film (hereinafter referred to as "polycrystalline silicon TFT") has been widely used in the related art. In the present specification, the TFT that is positioned as the switching element for every pixel is referred to as "pixel TFT". Furthermore, a portion that corresponds to a pixel of a display device, of the active matrix substrate is referred to as "pixel" or "pixel area".

It has been proposed that instead of amorphous silicon or polycrystalline silicon, an oxide semiconductor is used as a material of the active layer of the TFT. This TFT is referred to as "oxide semiconductor TFT". The oxide semiconductor has higher mobility than the amorphous silicon. For this reason, it is possible that the oxide semiconductor TFT operates at a higher speed than the amorphous silicon TFT. Furthermore, the oxide semiconductor film is formed with a simpler process than the polycrystalline silicon film, and because of this, can also find application in devices in each of which a large area is necessary. An active matrix substrate (hereinafter referred to as "TFT substrate") that includes the oxide semiconductor TFT is disclosed in PTL 1 and NPL 1.

On the other hand, technologies are known that monolithically (integrally) provide a drive circuit, such as a gate driver or a source driver, in a frame area. The "frame area" refers to an area other than the display area in which multiple pixels are arranged, and is also referred to as "peripheral area" or "non-display area". In recent years, technologies that manufacture these drive circuits (monolithic drivers) using the oxide semiconductor TFT have been used. In the present specification, a TFT that constitutes a circuit such as the drive circuit is referred to as "circuit TFT", to provide a distinction from the pixel TFT.

FIG. 12 is a plan-view diagram for describing an outline of an active matrix substrate 2000 in the related art, which includes a monolithic gate driver. The active matrix substrate 2000 has a display area 800 and a non-display area 900 that is positioned in such a manner as to surround the display area 800. Multiple pixels are arranged in a row direction and in a column direction in the display area 800. In FIG. 12, a gate driver 910 is monolithically formed in a portion that is positioned to the right side and left side of the display area 800, of the non-display area 900. Furthermore, a source driver 920 is mounted in a portion that is positioned under the display area 800, using a Chip On Glass (COG) mounting method. A flexible printed wiring line substrate (FPC) 930 is further mounted in the non-display area 900.

In the configuration described above, when a surface size of a display device in which the active matrix substrate finds application is increased, in some cases, a circuit scale of the gate driver 910 is also increased, and a reduction (frame-narrowing) of a frame area is difficult to achieve.

In contrast to this, for example, a technology that forms a gate driver within a pixel in the display area 800 is disclosed in PTL 1 and NPL 1. This technology is referred to as in-pixel gate driver monolithic (IPGDM).

FIG. 13 is a plan-view diagram for describing an outline of an active matrix substrate 2001 in which the gate driver is formed within the pixel. In the active matrix substrate 2001, gate drivers 910 are arranged in a distributed manner within multiple pixels in the display area 800. Accordingly, because there is no need to form a complex circuit and a wiring connection in the non-display area 900, additional frame-narrowing can be realized regardless of a screen size.

CITATION LIST

Patent Literature

PTL 1: International Publication No. 2014/069529

Non Patent Literature

NPL 1: Kohei Tanaka, and 13 people, "FFD (Free Form Display) Technology", Sharp Technical Journal, No. 108, pp. 8-11, March 2015

SUMMARY OF INVENTION

Technical Problem

However, in the active matrix substrate 2001, the gate driver 910 is formed within the pixel. Because of this, there is a concern that an area ratio (hereinafter referred to as "pixel aperture ratio") of a light transmission area to an area of the pixel will decrease due to a wiring line and a TFT that constitute the gate driver 910. It is noted that, instead of the gate driver, for example, even in a case where any other drive circuit, such as a source driver, is formed within the pixel, the same problem occurs.

An object of an embodiment of the present invention, which was made in view of the problem described above is to increase a pixel aperture ratio and the light transmittance of an active matrix substrate in which a drive circuit that includes an oxide semiconductor TFT is provided within a pixel.

Solution to Problem

According to an embodiment of the present invention, there is provided an active matrix substrate that has a display area which includes multiple pixel areas, in which the display area has a substrate, multiple gate bus lines that are formed from a first metal film on the substrate, multiple source bus lines that are formed from a second metal film on the substrate, and a drive circuit that is supported on the substrate, in which the drive circuit includes a first circuit TFT, in which each of the multiple pixel areas includes a pixel TFT and a pixel electrode that is connected to the pixel TFT, in which at least one of the multiple pixel areas further includes the first circuit TFT and a drive circuit wiring line that is connected to the first circuit TFT, in which each of the pixel TFT and the first circuit TFT is an oxide semiconductor TFT that includes a gate electrode, an oxide semiconductor layer, a gate insulating layer that is positioned between the gate electrode and the oxide semiconductor layer, and a source electrode and a drain electrode that are electrically connected to the oxide semiconductor layer, in which the drain electrode of the pixel TFT is electrically connected to the pixel electrode, the gate electrode of the pixel TFT is electrically connected to any one of the multiple gate bus lines, and the source electrode of the pixel TFT is electrically connected to any one of the multiple source bus lines, in which the pixel electrode is formed from an upper transparent conductive film, in which the drive circuit wiring line includes a transparent wiring line portion that is formed from a lower transparent conductive film which is positioned closer to the substrate than the upper transparent conductive film, and in which at least one of the source electrode and the drain electrode of the first circuit TFT is formed from the lower transparent conductive film.

In a certain embodiment, the source electrode of the pixel TFT is formed from the second metal film.

In a certain embodiment, the source electrode of the pixel TFT is formed from the lower transparent conductive film.

In a certain embodiment, the transparent wiring line portion includes the source electrode and the drain electrode of the first circuit TFT.

In a certain embodiment, the drain electrode of the pixel TFT is formed in a manner that is integrally combined with the pixel electrode, using the upper transparent conductive film.

In a certain embodiment, the multiple pixel areas are arranged in matrix form in a first direction and a second direction, and the transparent wiring line portion of the drive circuit wiring line includes a portion that extends crossing the at least one pixel area in the first direction or the second direction.

In a certain embodiment, the active matrix substrate further includes: a non-display area that is positioned in the vicinity of the display area, in which the non-display area includes a peripheral circuit that is supported on the substrate, in which the peripheral circuit includes multiple peripheral circuit TFTs that include a second circuit TFT, and in which the second circuit TFT is a crystalline silicon TFT that includes a gate electrode, a crystalline silicon semiconductor layer, a gate insulating layer that is positioned between the gate electrode and the crystalline silicon semiconductor layer, and a source electrode and a drain electrode that are brought into contact with the crystalline silicon semiconductor layer.

In a certain embodiment, the first circuit TFT and the pixel TFT each have a bottom gate structure, and the second circuit TFT has a top gate structure, any of the gate electrode of each of the first circuit TFT, the second circuit TFT, and the pixel TFT is formed from the first metal film, and the crystalline silicon semiconductor layer of the second circuit TFT is closer to the substrate than the first metal film.

In a certain embodiment, the drive circuit wiring line includes a connection portion that is formed from the same crystalline silicon film as the crystalline silicon semiconductor layer.

In a certain embodiment, the drive circuit wiring line is formed from the first metal film or the second metal film and further includes a first metal portion and a second metal portion that are arranged separately from each other, and the connection portion is electrically connected to the first metal portion and the second metal portion.

In a certain embodiment, each of the multiple pixel areas further includes a common electrode that is formed from any other transparent conductive film, and a dielectric layer that is positioned between the common electrode and the pixel electrode.

In a certain embodiment, the oxide semiconductor layer contains indium and tin.

In a certain embodiment, the oxide semiconductor layer contains an In—Sn—Zn—O-based semiconductor.

In a certain embodiment, the lower transparent conductive film is made of indium zinc oxide.

According to another embodiment of the present invention, there is provided a method of manufacturing any one of the active matrix substrates described above, the method including: (a) a process of forming a first metal film on a substrate and of forming the multiple gate bus lines and the gate electrodes of the first circuit TFT and the pixel TFT by patterning the first metal film; (b) a process of forming the gate insulating layer that covers the gate electrode of each of the first circuit TFT and the pixel TFT; (c) a process of forming the oxide semiconductor layer of each of the first circuit TFT and the pixel TFT on the gate insulating layer; (d) a process of forming a lower transparent conductive film on the oxide semiconductor layer and the gate insulating layer of the first circuit TFT and the pixel TFT, patterning the lower transparent conductive film, and thus forming the transparent wiring line portion that is brought into contact with the oxide semiconductor layer of the first circuit TFT; and (e) a process of forming a second metal film on the oxide semiconductor layer and the gate insulating layer, patterning the second metal film, and thus forming the multiple source bus lines and the source electrode of the pixel TFT.

In a certain embodiment, the oxide semiconductor layer of each of the first circuit TFT and the pixel TFT includes an oxide semiconductor that contains indium and tin, the lower transparent conductive film contains indium tin oxide or indium zinc oxide, and, in the process (d), wet-etching of the lower transparent conductive film is performed with mixed acid containing phosphoric acid, nitric acid, and acetic acid as etching liquid.

According to still another embodiment, there is provided an active matrix substrate that has a display area which includes multiple pixel areas, and a non-display area which is positioned in the vicinity of the display area, in which the display area has a substrate, multiple gate bus lines, multiple source bus lines, and a drive circuit that is supported on the substrate and includes a first circuit TFT, in which the non-display area includes a peripheral circuit that includes a second circuit TFT, in which each of the multiple pixel areas includes a pixel TFT, and a pixel electrode that is connected to the pixel TFT, in which at least one of the multiple pixel areas further includes the first circuit TFT and a drive circuit wiring line that is connected to the first circuit TFT, in which each of the pixel TFT and the first circuit TFT is an oxide semiconductor TFT that has an oxide semiconductor layer as an active region, in which the second circuit TFT is a crystalline silicon TFT that has a crystalline silicon semiconductor layer as an active region, and in which at least a portion of the drive circuit wiring line is formed from the same crystalline silicon film as a crystalline silicon semiconductor layer.

Advantageous Effects of Invention

According to the embodiments, it is possible that a pixel aperture ratio and the light transmittance of an active matrix substrate in which a drive circuit that includes an oxide semiconductor TFT is provided within a pixel are increased.

BRIEF DESCRIPTION OF DRAWINGS

FIG. 3(a) is a diagram illustrating an example of a circuit that is equivalent to a gate driver 110. FIG. 3(b) is a diagram illustrating an example in which the gate driver 110 is positioned within a pixel.

FIG. 4(a) is a plan-view diagram illustrating one pixel area Pix1 in the active matrix substrate 1001 according to the first embodiment. FIG. 4(b) is a cross-sectional diagram of a pixel TFT and a first circuit TFT in the active matrix substrate 1001.

FIG. 7(a) is a circuit diagram illustrating any other gate driver 210. FIG. 7(b) is a diagram illustrating a signal waveform for driving the gate driver 210.

FIG. 11(a) is a cross-sectional diagram illustrating any other active matrix substrate 1005 according to the third embodiment. FIG. 11(b) is an enlarged plan-view diagram illustrating a portion of the active matrix substrate 1005.

DESCRIPTION OF EMBODIMENTS

First Embodiment

An active matrix substrate according to a first embodiment of the present invention will be described below with reference to the drawings. The active matrix substrate according to the present embodiment has a monolithic gate driver within a display area. The source driver, for example, is provided in the active matrix substrate, using a COG mounting method.

Figure 1:
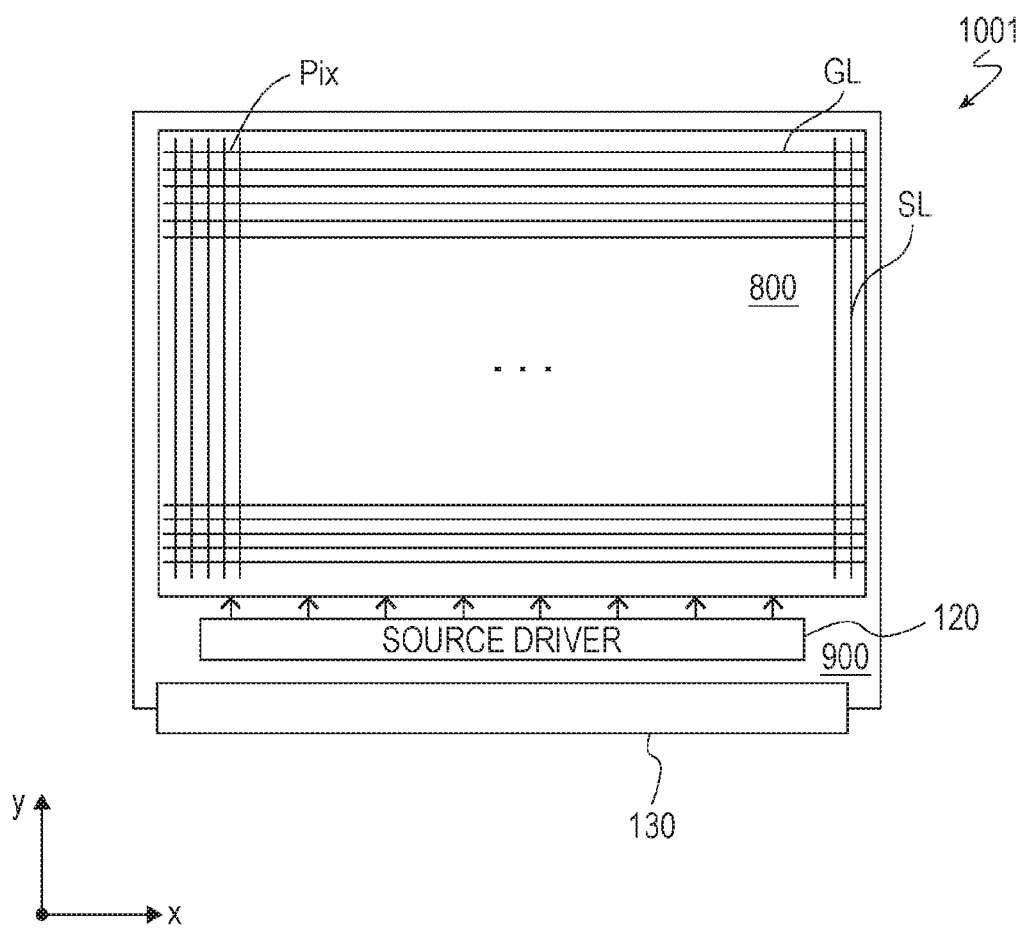
FIG. 1 is a plan-view diagram illustrating an outline of an active matrix substrate 1001 according to a first embodiment.

FIG. 1 is a plan-view diagram illustrating an outline of an active matrix substrate 1001 according to the present embodiment.

As illustrated in FIG. 1, the active matrix substrate 1001 includes multiple pixel areas Pix that are arranged in matrix form in a first direction x and a second direction y, multiple gate bus lines GL that extend in the first direction x, and multiple source bus lines SL that extend in the second direction y. An area 800 that includes the multiple pixel areas Pix, of the active matrix substrate 1001 is referred to as "display area", and an area 900 that is positioned in the vicinity of the display area 800 is referred to as "non-display area" (or "frame area"). Mounted in the non-display area 900 are a source driver 120 and an FPC substrate 130. Furthermore, a terminal portion, an SSD circuit, an inspection circuit, and the like can be provided.

Although not illustrated, a gate driver is formed in the display area 800 in such a manner that the gate driver extends across the multiple pixel areas Pix. Gate bus lines GL are connected to terminals, respectively, of the gate driver. Source bus lines SL are connected to terminals, respectively, of the source driver 120.

Figure 2:
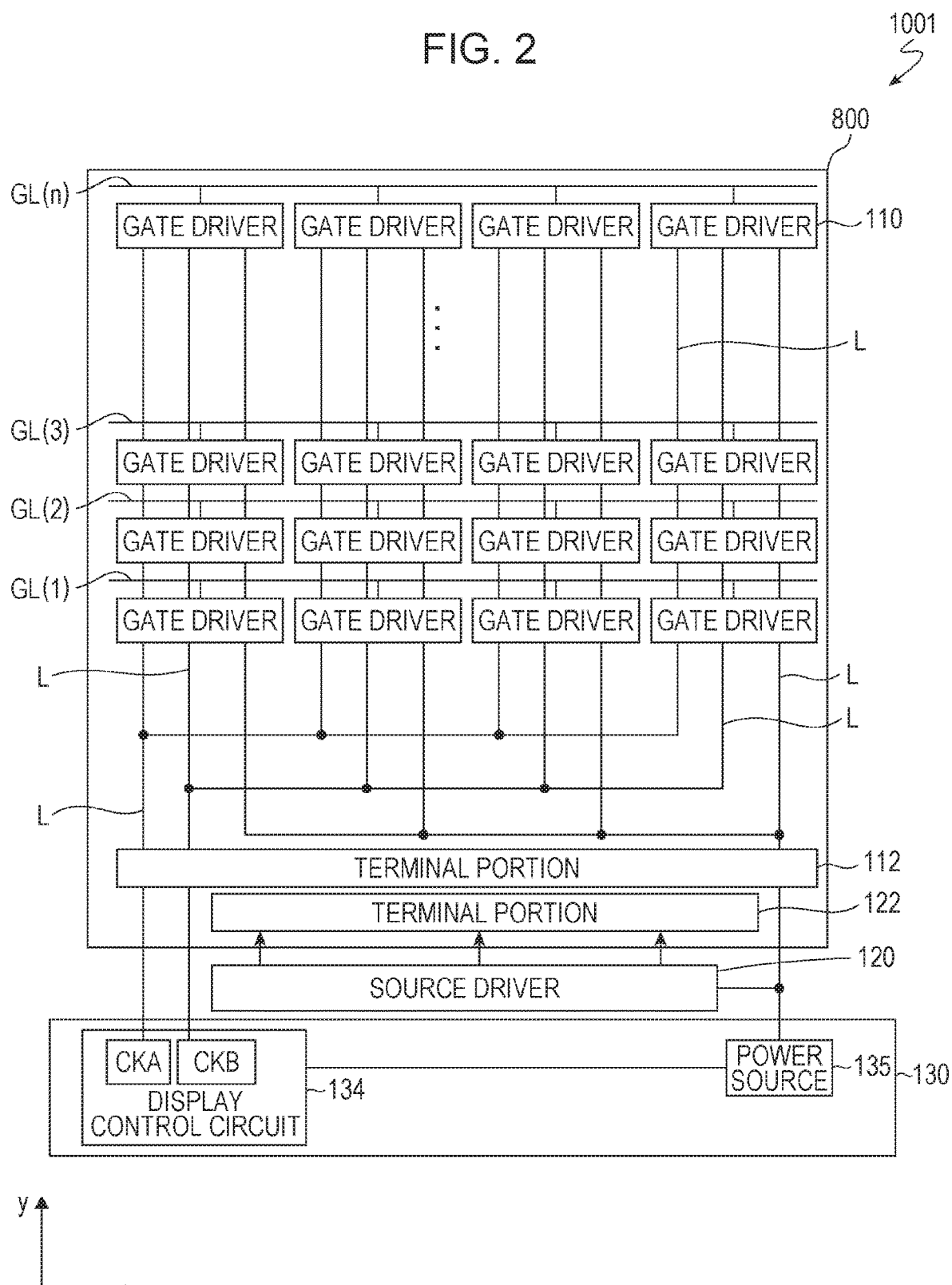
FIG. 2 is a plan-view diagram for describing an arrangement of gate drivers and terminal portions in the active matrix substrate 1001.

FIG. 2 is a plan-view diagram for describing an arrangement of the gate drivers and the terminal portions in the active matrix substrate 1001. For simplification, the source bus line SL is omitted.

The gate driver 110 is formed between each of the gate bus lines GL(1) to GL(n) that are arranged in the display area 800. In this example, four gate drivers 110 are connected to the gate bus lines GL, respectively.

Mounted in the non-display area 900 are mounted the source driver 120 and the FPC substrate 130 on which a control circuit 134 and a power source 135. Furthermore, a terminal portion (a first terminal portion) 112 through which various signals are supplied to the gate driver 110, and a terminal portion (a second terminal portion) 122 through which a connection is made between the source driver 120 and the source bus line SL are provided in the gate driver 110. The source driver 120 outputs a data signal to each source bus line SL according to a control signal that is input from the control circuit 134.

The terminal portion 112 is connected to the control circuit 134 and the power source 135. The terminal portion 112 receives signals such as control signals (CKA and CKB) that are output from the control circuit 134 and the power source 135 and a power source voltage signal that is output from the power source 135. Signals, such as the control signals (CKA and CKB) and the power source voltage signal, that are input into the terminal portion 112 are supplied to each gate driver 110 through a drive circuit wiring line L. According to a signal that is supplied, the gate driver 110 not only outputs a voltage signal that represents one of a selection state and a non-selection state to the gate bus line GL that is connected, but also outputs its voltage signal to a gate bus line GL in the next stage. In the following description, in some cases, the voltage signal that corresponds to each of the selection state and the non-selection state is referred to as a scanning signal. Furthermore, a state where the gate bus line GL is selected is referred to as driving of the gate bus line GL.

In the present embodiment, within the display area 800, multiple gate drivers 110 are connected to gate bus lines GL, respectively. The gate drivers 110 that are connected to the same gate bus line GL are synchronized, and the gate bus lines GL are driven with scanning signals that are output from these gate drivers 110, respectively.

FIG. 3(a) is a diagram illustrating an example of a circuit that is equivalent to the gate driver 110. The gate driver 110 includes a TFT-a for precharging a net A that is an internal node of the gate driver 110, a TFT-b for discharging electric potential of the internal node net A, a TFT-c that is an output transistor for supplying a signal to the gate bus line GL, a TFT-d for retaining electric potential of the gate bus line GL, and a capacitor Cbst that is formed between the internal node net A and the gate bus line GL. Input terminals for clock signals (CKA and CKB), a power wiring line for supplying power (VSS), and the like are connected to the gate driver 110.

In FIG. 3(b), an example is illustrated in which the equivalent circuit that is illustrated in FIG. 3(a) is positioned within a pixel. In FIG. 3(b), a pixel TFT and a pixel circuit are omitted.

The gate driver 110 is positioned over multiple pixel areas. Multiple TFTs and the capacitors Cbst that constitute the gate driver 110 are arranged in different pixels, respectively. Each TFT and the capacitor Cbst are connected with a drive circuit wiring line that extends across a pixel.

In the present embodiment, multiple circuit TFTs and pixel TFTs that constitute the gate driver 110 are oxide semiconductor TFTs. Furthermore, at least one of a source electrode and a drain electrode in at least one of the multiple circuit TFTs is a transparent electrode that is formed from a transparent conductive film (hereinafter referred to as "first transparent conductive film" or "lower transparent conductive film"). This TFT structure is referred to as "transparent TFT structure", and a circuit TFT that has the transparent TFT structure is referred to as "first circuit TFT".

At least one or several of drive circuit wiring lines that constitute the gate driver 110 are formed from the first transparent conductive film. In the present specification, a portion that is formed from the first transparent conductive film, of the drive circuit wiring line is referred to as "transparent wiring line portion". The first transparent wiring line portion is formed from a transparent conductive film that is different from a pixel electrode and a common electrode. The transparent wiring line portion may be brought into contact with an oxide semiconductor layer of the first circuit TFT and may include a portion that functions as a source electrode or a drain electrode.

A structure of a pixel area in the active matrix substrate 1001 will be described in more detail below.

FIG. 4(a) is a plan-view diagram illustrating one pixel area Pix1 in the active matrix substrate 1001 according to the present embodiment. FIG. 4(b) is a cross-sectional diagram of the pixel TFT and the first circuit TFT in the active matrix substrate 1001 and illustrates a cross-section along taken line A-A' and line B-B' in FIG. 4(a).

The pixel area Pix1 is an area that is surrounded with the source bus line SL that extends in the x direction and the gate bus line GL that extends in a y direction that orthogonally intersects the x direction.

The pixel area Pix1 has a substrate 1, a pixel TFT 20 that is supported on the substrate 1, and a pixel electrode 15. The pixel TFT 20 is an oxide semiconductor TFT. A portion of the gate driver 110 is further provided in the pixel area Pix. In this example, one circuit TFT (the first circuit TFT) 10 that constitutes the gate driver 110 and a first wiring line L1 to a third wiring line L3 that are drive circuit wiring lines L are arranged with the pixel area Pix1. A first circuit TFT 10 is an oxide semiconductor TFT that has the transparent TFT structure. The first circuit TFT 10, for example, is equivalent to the TFT-c that is illustrated in FIG. 3(b). Furthermore, at least a portion (at this point, the first wiring line L1 or the second wiring line L2) of the drive circuit wiring line L that is positioned within the pixel area Pix1 is a transparent wiring line portion that is formed from the first transparent conductive film. It is noted that positions at which a circuit element which is positioned in each pixel area, the drive circuit wiring line L, the transparent wiring line portion and the like are positioned, a method of connecting them, and the like are not limited to an example that is illustrated.

Each layer that constitutes the active matrix substrate 1001 is described with reference to FIG. 4(b).

The active matrix substrate 1001 has a gate metal layer M1 that includes multiple gate bus lines GL, a gate insulating layer 5, oxide semiconductor layers 7A and 7B that are active layers, respectively, of the first circuit TFT 10 and the pixel TFT 20, a source metal layer M2 that includes multiple source bus lines SL, and an inter-layer insulating layer 13 that covers the first circuit TFT 10 and the pixel TFT 20, in this order, starting from the substrate 1 side. The gate metal layer M1 refers to a layer that is formed from the same metal film (hereinafter referred to as "gate metal film" or "first metal film") as the gate bus line GL. In the same manner, the source metal layer M2 refers to a layer that is formed from the same metal film (hereinafter referred to as "source metal film" or "second metal film") as the source bus line SL.

A first transparent conductive layer T1 is positioned between each of the oxide semiconductor layer 7A and the oxide semiconductor layer 7B and the inter-layer insulating layer 13, separately from the source metal layer M2. The first transparent conductive layer T1 refers to a layer that is formed from the first transparent conductive film as the transparent wiring line portion. In this example, the first wiring line L1 and the second wiring line L2 (the transparent wiring line portions) of the drive circuit wiring line L are transparent wiring lines that are formed within the first transparent conductive layer T1.

A second transparent conductive layer T2 that includes the pixel electrode 15, a dielectric layer 17, and a third transparent conductive layer T3 that includes a common electrode 19 are formed in this order on the inter-layer insulating layer 13. The second transparent conductive layer T2 refers to a layer that is formed from the same transparent conductive film (hereinafter referred to "second transparent conductive film" or "upper transparent conductive film) as the pixel electrode, and the third transparent conductive layer T3 refers to a layer that is formed from the same transparent conductive film (hereinafter referred to as "first transparent conductive film") as the common electrode. The first to third transparent conductive films, for example, can be indium tin oxide (ITO), indium zinc oxide (IZO), or the like.

It is noted that the order of the layers is not limited to an example that is illustrated. The source metal layer M2 may be positioned toward the substrate 1 on each of the oxide semiconductor layer 7A and the oxide semiconductor layer 7B. The first transparent conductive layer T1 may be positioned between the substrate 1 and the second transparent conductive layer T2. Furthermore, as will be described below, the third transparent conductive layer T3 may be positioned closer to the substrate 1 than the second transparent conductive layer T2.

Subsequently, structures of the first circuit TFT 10 and the pixel TFT 20 are described in more detail.

The first circuit TFT 10 is a TFT that has a bottom gate structure in which a gate electrode 3A that is supported on the substrate 1, the gate insulating layer 5 that covers the gate electrode 3A, the oxide semiconductor layer 7A that is formed on the gate insulating layer 5, and a source electrode 8 and a drain electrode 9 that are arranged in such a manner as to be brought into contact with the oxide semiconductor layer 7A are included. The source electrode 8 and the drain electrode 9 are transparent electrodes that are formed using the first transparent conductive film.

The drain electrode 9 is connected to the first wiring line L1, the source electrode 8 to the second wiring line L2, and the gate electrode 3A to the third wiring line L3. At this point, the first wiring line L1 extends in such a manner as to cross the pixel area Pix1 in the y direction, and is connected to an input terminal (not illustrated) of a clock signal CKA that is positioned in the non-display area 900. The second wiring line L2 extends up to a gate bus line GL(n−1) and is brought into contact with the gate bus line GL(n−1) within an opening portion 5p that is formed in the gate insulating layer 5. The third wiring line L3 crosses a source bus line SL(n), extends to any other neighboring pixel area, and constitutes the internal node net A of the gate driver 110.

The gate electrode 3A and the third wiring line L3 may be integrally formed within the gate metal layer M1. In this case, a portion that overlaps the oxide semiconductor layer 7A with the gate insulating layer 5 in between, of the third wiring line L3 is referred to as the gate electrode 3A. The drain electrode 9 and the first wiring line L1 may be integrally formed within the first transparent conductive layer T1. In other words, the first wiring line L1 may include a portion that is brought into contact with the oxide semiconductor layer 7A and functions as the drain electrode 9. In the same manner, the source electrode 8 and the second wiring line L2 may be integrally formed within the first transparent conductive layer T1. A portion that is brought into contact with the oxide semiconductor layer 7A, of the first wiring line L1 is referred to as the drain electrode 9, and a portion that is brought into contact with the oxide semiconductor layer 7A, of the second wiring line L2 is referred to as the source electrode 8.

The pixel TFT 20 is a TFT that has the bottom gate structure TFT in which a gate electrode 3B that is supported on the substrate 1, the gate insulating layer 5 that covers the gate electrode 3B, the oxide semiconductor layer 7B that is formed on the gate insulating layer 5, and the source electrode 28 and the drain electrode 29 that are arranged in such a manner as to be brought into contact with the oxide semiconductor layer 7B are included. A source electrode 28 is a metal electrode that is formed within a source metal layer. A drain electrode 29 is a transparent electrode that is formed using the second transparent conductive film.

The gate electrode 3B is connected to the corresponding gate bus line GL, and the source electrode 28 is connected to the corresponding source bus line SL. The drain electrode 29 is electrically connected to the pixel electrode 15.

The gate electrode 3B and the gate bus line GL may be integrally formed within the gate metal layer. A portion that is brought into contact with the oxide semiconductor layer 7B, of the gate bus line GL is referred to as the gate electrode 3B. The source electrode 28 and the source bus line SL may be integrally formed within the source metal layer. The drain electrode 29 may be formed in a manner that is integrally combined with the second transparent conductive layer T2 within the pixel electrode 15. A portion that is brought into contact with the oxide semiconductor layer 7B, of the source bus line SL is referred to as the source electrode 28, and a portion that is brought into the oxide semiconductor layer 7B, of the pixel electrode 15 is referred to as the drain electrode 29.

As will be described below, the source electrode 28 may be a transparent electrode that is formed within the first transparent conductive layer T1. Furthermore, the drain electrode 29 may not be formed in a manner that is integrally combined with the pixel electrode 15. In this case, the drain electrode 29, for example, may be a metal electrode that is formed within the source metal layer. Moreover, the source electrode 8 and the drain electrode 9 may be electrically connected to both the sides, respectively, of a channel region of the oxide semiconductor layer 7A, and may be connected directly to the oxide semiconductor layer 7A. Furthermore, the source electrode 28 and the drain electrode 29 may not be electrically connected to both the sides, respectively, of a channel region of the oxide semiconductor layer 7B, and may be not be connected directly to the oxide semiconductor layer 7B.

Oxide semiconductors of the oxide semiconductor layers 7A and 7B each contain, for example, In and Sn. As these oxide semiconductors, an In—Sn—Zn—O-based semiconductor, an In—Ga—Sn—O-based semiconductor, an In—Al—Sn—Zn—O-based semiconductor, and the like are given. Accordingly, as will be described below, it is possible that in the first circuit TFT 10, patterning of the first transparent conductive film for separating a source and a drain is performed with wet etching.

The inter-layer insulating layer 13 includes an inorganic insulating layer (a passivation film) 11 and an organic insulating layer 12 that is positioned on the inorganic insulating layer 11. The pixel electrode 15 is formed on the inter-layer insulating layer 13 and is brought into contact with the oxide semiconductor layer 7B within an opening portion 13p that is provided in the inter-layer insulating layer 13. It is noted that the organic insulating layer 12 may not be included.

The pixel electrode 15 and the common electrode 19 are arranged in such a manner as to overlap in part with the dielectric layer 17 in between. The pixel electrode 15 is separated from every pixel. The common electrode 19 may be formed over all portions of the pixel area Pix1 except for an area in which the pixel TFT 20 is formed. The common electrode 19 may not be separated from every pixel. The active matrix substrate 1001 can find application in display devices that operate in a Fringe Field Switching (FFS) mode. The FFS mode is a mode in compliance with a transverse electric field method in which a pair of electrodes is provided on one substrate and in which an electric field is applied, in a direction (in the horizontal direction) in parallel to a surface of the substrate, to liquid crystal molecules. In this example, an electric field is generated that is expressed as a line of electric force which gets out of the pixel electrode 15, passes through a liquid crystal layer (not illustrated) and further through an opening in the shape of a slit in the pixel electrode 15, and gets to the common electrode 19. This electric field has a component in the horizontal direction with respect to the liquid crystal layer. As a result, the electric field in the horizontal direction can be applied to the liquid crystal layer. In a transverse electric field method, a liquid crystal molecule does not rise up from the substrate. Because of this, there is an advantage in that the transverse electric field method can realize a wider viewing angle than a vertical-direction electric field method.

An electrode structure in which the pixel electrode 15 is positioned on the common electrode 19 with the dielectric layer 17 in between, for example, is described in International Publication No. 2012/086513. It is noted that the common electrode 19 may be positioned on the pixel electrode 15 with the dielectric layer 17 in between. In other words, the pixel electrode 15 may be formed within the second transparent conductive layer T2, and the common electrode 19 may be formed within the third transparent conductive layer T3. This electrode structure is described, for example, in Japanese Unexamined Patent Application Publication Nos. 2008-032899 and 2010-008758. For reference, the entire contents of International Publication No. 2012/086513 and Japanese Unexamined Patent Application Publication Nos. 2008-032899 and 2010-008758 are incorporated in the present specification by reference.

In the active matrix substrate 1001 according to the present embodiment, at least a portion of the drive circuit wiring line L that constitutes the gate driver 110, and a source or drain electrode of the first circuit TFT is formed from the transparent conductive film. Accordingly, the gate driver 110 is provided within a pixel. Thus, a pixel aperture ratio can be suppressed from decreasing, and the active matrix substrate 1001 that has high light utilization efficiency can be realized.

Figure 13:
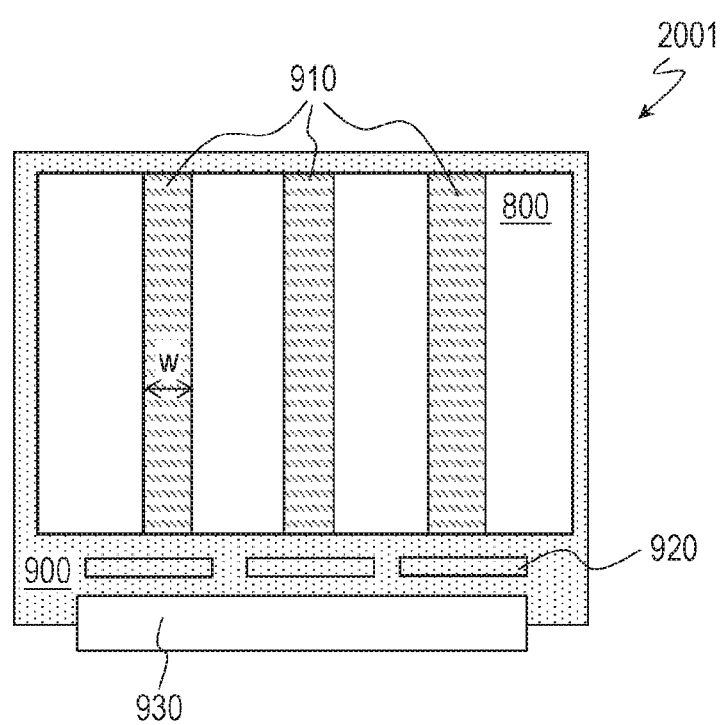
FIG. 13 is a plan-view diagram for describing an outline of an active matrix substrate 2001 in which the gate driver is formed within the pixel.

Furthermore, in the related, in order to secure the pixel aperture ratio, there is a need to distribute the gate driver 110 widely for positioning. In contrast to this, according to the present embodiment, it is possible that while securing the pixel aperture ratio, the gate driver 110 is formed at a higher density. Therefore, a circuit width (a width w that is illustrated in FIG. 13) of the gate driver 110 can be decreased much more greatly. As a result, the degree of freedom in a shape of the display area can be increased, and for example, application in devices in an arbitrary shape, such as a circular shape, can also be possible.

<Method of Manufacturing the Active Matrix Substrate 1001>

Next, an example of a method of manufacturing the active matrix substrate 1001 according to the present embodiment is described with reference again to FIG. 4.

First, a gate metal film (the first metal film) is formed on the substrate 1, and then the gate metal film is patterned with a known photolithography process. Accordingly, the gate metal layer M1 that includes the gate bus line GL and the gate electrodes 3A and 3B is formed.

As the substrate 1, a transparent substrate having an insulating property can be used. At this point, a glass substrate is used. As the gate metal film, a film that contains a metal, such as aluminum (Al), tungsten (W), molybdenum (Mo), tantalum (Ta), chrome (Cr), titanium (Ti), or copper (Cu), an alloy of these, or metal nitride of these can be suitably used. Furthermore, a multi-layered film that results from stacking these multiple films may be used. The thickness of the gate metal film, for example, is equal to or greater than 50 nm and is equal to smaller than 500 nm. At this point, a Cu film and a Ti film are formed in this order, and thus a multi-layered film is obtained.

Subsequently, the gate insulating layer 5 is formed in such a manner as to cover the gate metal layer M1. Thereafter, using known photolithography, the opening portion 5$p$ that extends to the gate bus line GL(n) is formed in the gate insulating layer 5. As the gate insulating layer 5, for example, a silicon oxide ($SiO_2$) layer or a silicon nitride (SiNx) layer may be used. At this point, as the gate insulating layer 5, a multi-layered film of which an upper layer is the silicon oxide ($SiO_2$) layer (the thickness thereof is 50 nm) and of which a lower layer is the silicon nitride (SiNx) layer (the thickness thereof is 325 nm) is used.

Subsequently, an oxide semiconductor film is formed on the gate insulating layer 5, for example, using a sputtering method, and this oxide semiconductor film is patterned. Thus, the oxide semiconductor layers 7A and 7B are obtained. The oxide semiconductor layers 7A and 7B are arranged in such a manner as to overlap the gate electrodes 3A and 3B, respectively, with the gate insulating layer 5 in between. At this point, as the oxide semiconductor film, for example, an In—Sn—Zn—O-based semiconductor film (the thickness thereof is 70 nm) is used. The thickness of the oxide semiconductor film, for example, may be equal to or greater than 10 nm and be equal to or smaller than 110 nm. The oxide semiconductor layer 7 is formed, and then oxidation processing may be formed such as $N_2O$ plasma processing.

Subsequently, the first transparent conductive film is formed in such a manner as to cover the gate insulating layer 5 and the oxide semiconductor layers 7A and 7B, and the first transparent conductive layer T1 that includes the transparent wiring line portion of the drive circuit wiring line L is formed by patterning the first transparent conductive film. The transparent wiring line portion includes the first wiring line L1, the second wiring line L2, and the source electrode 8 and the drain electrode 9 of the first circuit TFT 10. As the first transparent conductive film, for example, an indium tin oxide (ITO) film, an indium zinc oxide (IZO) film, a zinc oxide film (ZnO film), or the like can be used. At this point, as the transparent conductive film, the IZO film (the thickness thereof is 75 nm).

In this example, the oxide semiconductor layers 7A and 7B are In—Sn—Zn—O-based semiconductor layers. The In—Sn—Zn-0-based semiconductor has high mobility. However, when the In—Sn—Zn—O-based semiconductor is reduced and an oxygen defect occurs, a threshold voltage is easy to shift in a negative direction. For this reason, it is preferable that the source and drain electrodes 8 and 9 that come into direct contact with the oxide semiconductor layer 7A is formed from a transparent conductive film (for this reason, an IZO film) that contains a small amount of hydrogen.

The patterning of the first transparent conductive film may be performed by dry etching and may be performed by wet etching. When the wet etching is used, separation for a source and a drain can be performed while damage to the oxide semiconductor layer 7A is suppressed. Because of this, the use of the wet etching is advantageous.

In a case where the ITO film or the IZO film is used as the first transparent conductive film, it is difficult to wet-etch these oxide films. Because of this, generally, the wet etching is used for patterning these oxide films. However, an active matrix substrate in the related art, which uses an In—Ga—Zn—O-based semiconductor, in some cases, the oxide semiconductor such as the In—Ga—Zn—O-based semiconductor is also etched with etching liquid that is used when patterning the ITO film or the IZO film. For this reason, there is a need to form an etch stop layer in such a manner that the oxide semiconductor layer is not etched.

In contrast to this, as a result of the study by the present inventor, it was found that, when an oxide semiconductor layer that contains In and Sn is used as the oxide semiconductor layers 7A and 7B and, for example, mixed acid (a mixture of phosphoric acid, nitric acid and acetic acid) that consist of phosphoric acid, nitric acid and acetic acid is used as the etching liquid, the problem describe above was solved. The first transparent conductive film (the ITO film or the IZO film) is solved in the mixture of phosphoric acid, nitric acid, and acetic acid, and the oxide semiconductor (the In—Sn—Zn—O-based semiconductor, the In—Ga—Sn—O-based semiconductor, or the like) that contains In and Sn is not solved in the mixture of phosphoric acid, nitric acid, and acetic acid. Therefore, when the mixture of phosphoric acid, nitric acid, and acetic acid is used, patterning (the separation for a source and a drain) of a first transparent conductive film can be performed without protecting the oxide semiconductor layer 7A using the etch stop layer. Because of this, productivity can be increased.

It is noted that the patterning of the first transparent conductive film may be performed using the dry etching. In this case, at the time of the dry etching, a surface of the oxide semiconductor layer 7A is also etched (over-etching) and the thickness of the oxide semiconductor layer 7A is decreased. Thus, there is a likelihood that an amount of on-electric current will be decreased. Therefore, it is preferable that, considering an amount of over-etching, the thickness of the oxide semiconductor layer 7A at the time of film formation is set, in advance, to be great.

Thereafter, the second metal film is formed in such a manner as to cover the gate insulating layer 5 and the oxide semiconductor layers 7A and 7B, and the source metal layer M2 that includes the source electrode 28 of the pixel TFT 20 and the source bus line SL are formed by patterning the source metal film (the second metal film). As the source metal film, a film that contains a metal, such as aluminum (Al), tungsten (W), molybdenum (Mo), tantalum (Ta), chrome (Cr), titanium (Ti), or copper (Cu), an alloy of these, or metal nitride of these can be suitably used. Furthermore, a multi-layered film that results from stacking these multiple films may be used. Alternatively, a conductive oxide film may be used such as In—Zn—O (IZO). At this point, a Ti film and a Cu film are formed in this order, and thus a multi-layered film is obtained. The thickness of the source metal film, for example, is equal to or greater than 50 nm and is equal to or smaller than 500 nm.

It is noted that the order in which the first transparent conductive layer T1 and the source metal layer M2 are formed does not particularly matter. The formation of the first transparent conductive layer T1 after the formation of the source metal layer M2 does not pose any problem.

The first transparent conductive layer T1 and the source metal layer M2 are formed, and then the inorganic insulating layer 11 is formed in such a manner as to cover the source metal layer M2 and the oxide semiconductor layers 7A and 7B. As the inorganic insulating layer 11, a silicon oxide ($SiO_2$) film, a silicon nitride (SiNx) film, a silicon-oxide-nitride (SiOxNy; x>y) film, a silicon nitride oxide (SiNxOy; x>y) film, or a multi-layered film that results from stacking these can be used. At this point, as the inorganic insulating layer 11, for example, a multi-layered film that includes a silicon oxide ($SiO_2$) film (the thickness thereof is 300 nm) and a silicon nitride (SiNx) film (the thickness thereof is 150 nm) that is formed on the silicon oxide film. It is preferable that the thickness of the inorganic insulating layer, for example, is equal to or greater than 100 nm and is equal to or smaller than 500 nm, preferably, is equal to or greater than 200 nm and is equal to or smaller than 500 nm.

Thereafter, annealing processing may be performed in order to eliminate the oxygen defect that occurs in the oxide semiconductor layers 7A and 7B when patterning the first transparent conductive film and the source metal film. A temperature in the annealing processing is not particularly limited, but, for example, may be equal to or higher than 250° C. and be equal to or lower than 450° C., preferably, may be equal to or higher than 300° C. and be equal to or lower than 400° C. When processing is performed at 300° C. or higher, a defect level can be more effectively lowered. Because of this, the TFT reliability can be further improved.

It is noted that, in a case where electrodes that are made of a metal such as Ti are used as source and drain electrodes, when the annealing processing is performed at a high temperature (for example, 300° C. or higher), there is a likelihood that hydrogen which is occluded in the metal will be discharged at an interface at which the metal electrode and the oxide semiconductor layer are in contact with each other, when the annealing processing is performed. Thus, it is noted that oxygen in the oxide semiconductor will be extracted and a concentration of carriers in the oxide semiconductor layer will be increased. As a result, there is a concern that a portion which is brought into contact with the source and drain electrodes, of a channel region of the oxide semiconductor layer will also be an electric conductor and that an effective channel length L will be shortened. When a temperature in the annealing processing is set to be low in order to avoid this, there is a concern that the sufficient reliability will not be obtained. In contrast to this, in the present embodiment, metal oxide materials, such as ITO and IZO, are used for the source electrode 8 and the drain electrode 9 of the first circuit TFT 10. An amount of hydrogen that is discharged from these metal oxide materials when performing the annealing processing is smaller than an amount of hydrogen that is discharged from metals such as Ti. For this reason, although the annealing processing is performed at a high temperature, it is difficult for a defect, which causes the effective channel length L to be shortened, to occur. Therefore, for example, by performing the annealing processing a high temperature of 300° C. or higher, it is possible that, while securing a desired TFT characteristic, the reliability of the first circuit TFT 10 is further increased.

Subsequently, the organic insulating layer (the thickness thereof, for example, is 1 μm to 3 μm, preferably, is 2 μm to 3 μm) 12 is formed on the inorganic insulating layer 11. An organic insulating film that contains a photosensitive resin material may be formed as the organic insulating layer 12. Subsequently, the opening portion 13p through which a portion of the oxide semiconductor layer 7B is formed in the inorganic insulating layer 11 and the organic insulating layer 12. At this point, first, patterning of the organic insulating layer 12 is performed with the photolithography process, and an opening portion is provided in the organic insulating layer 12. Subsequently, etching of the inorganic insulating layer 11 is performed with the organic insulating layer 12 as a mask, and thus the opening portion 13p is formed.

Subsequently, the second transparent conductive film (the thickness thereof, for example, is equal to or greater than 50 nm and is equal to or smaller than 200 nm) is formed on the organic insulating layer 12 and within the opening portion 13p, and the second transparent conductive layer T2 that includes the pixel electrode 15 is formed by patterning the second transparent conductive film. As the second transparent conductive film, for example, an indium tin oxide (ITO) film, an indium zinc oxide (In—Zn—O-based oxide) film, a zinc oxide film (ZnO film), or the like can be used.

Subsequently, the dielectric layer 17 is formed in such a manner as to cover the second transparent conductive layer T2. As the dielectric layer 17, a silicon nitride (SiNx) film, a silicon oxide (SiOx) film, a silicon oxide nitride (SiOxNy; x>y) film, a silicon nitride oxide (SiNxOy; x>y) film, or the like can be suitably used. The thickness of the dielectric layer 17, for example, is equal to or greater than 70 nm and is equal to or smaller than 300 nm.

Subsequently, the third transparent conductive film is formed on the dielectric layer 17, and the third transparent conductive film is patterned. Thus, the third transparent conductive layer T3 that includes the common electrode 19 is formed. The suitable material and thickness of the third transparent conductive film may be the same as those of the second transparent conductive film. In this manner, the active matrix substrate 1001 is manufactured.

Modification Example

Figure 5:
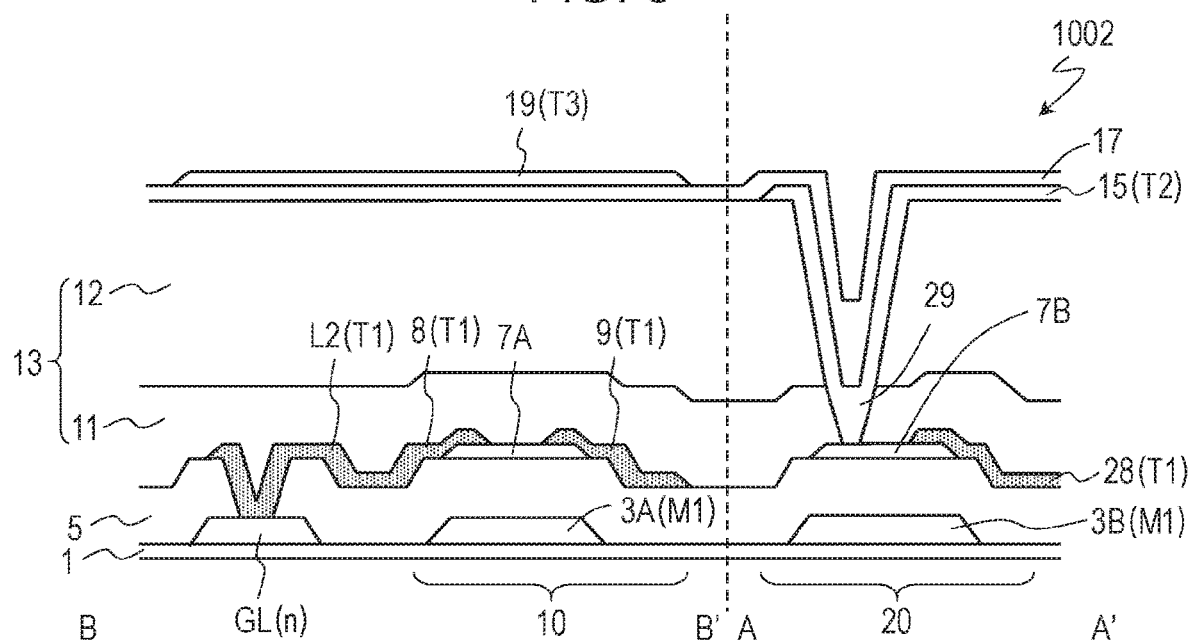
FIG. 5 is a cross-sectional diagram illustrating any other active matrix substrate 1002 according to the first embodiment.

FIG. 5 is a cross-sectional diagram illustrating any other active matrix substrate 1002 according to the present embodiment. In FIG. 5 and subsequent figures, a constituent element that is the same as that of the active matrix substrate 1001 is given the same reference character as that of the active matrix substrate 1001. Furthermore, a description of a constituent element that is the same as that of the active matrix substrate 1001 is suitably omitted.

As illustrated in FIG. 5, the active matrix substrate 1002 is different from the active matrix substrate 1001 in that the source electrode 28 of the pixel TFT 20 is the transparent electrode that is formed using the first transparent conductive film. The source electrode 28 is electrically connected to the corresponding source bus line SL. Although not illustrated, the source electrode 28 may extend up to a position at which the source electrode 28 overlaps the source bus line SL and may be brought into contact with a surface or a lower surface of the source bus line SL.

With the active matrix substrate 1002, the source electrode 28 of the pixel TFT 20 is formed using the transparent conductive film. Because of this, the pixel aperture ratio can be much more increased than in the active matrix substrate 1001 that is illustrated in FIG. 4.

<Operation of the Gate Driver and Modification Example of the Gate Driver Circuit>

Operation of the gate driver 110 according to the present embodiment is described here.

Figure 6:
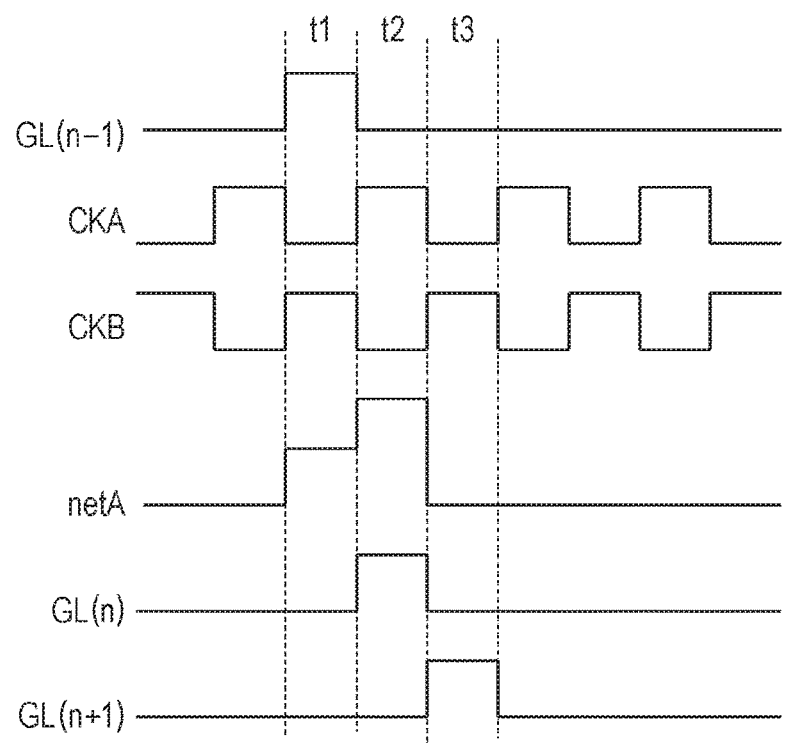
FIG. 6 is a diagram illustrating a signal waveform for driving the gate driver 110.

FIG. 6 is a diagram illustrating a signal waveform for driving the gate driver 110. First, during duration t1, an (n−1)-th gate signal S in the previous stage is input into the TFT-a of an n-th gate driver, and the internal node net A is precharged. At this time, the TFT-c and the TFT-d enters an ON state, CKA is at Low electric potential (VSS). Because of this, the gate bus line GL(n) is charged with Low electric potential (VSS). Next, during duration t2, CKA switches to High electric potential (VDD), and CKB switches to Low electric potential (VSS). At this time, because the TFT-c is in an ON state and the TFT-d is in an OFF state, the gate bus line GL(n) is charged with High electric potential (VDD) of CKA. Not only is the gate bus line GL(n) charged, but the internal node (net A) is further pushed up to high electric potential through the capacitor Cbst. Accordingly, a sufficiently high voltage for charging the gate bus line with High electric potential (VDD) can be applied to a gate electrode of TFT-c. Furthermore, during this duration, a signal of the gate bus line GL(n) is input into an (n+1)-th gate driver in the next stage, and an internal node thereof is precharged. Next, during duration t3, CKA switches to Low electric potential (VSS), and CKB switches to High electric potential (VDD). Accordingly, the gate bus line GL(n) is discharged to Low electric potential (VSS) through the TFT-d. Furthermore, at this time, the (n+1)-th gate bus line in the next stage is charged with High electric potential (VDD). Because of this, the TFT-b enters an ON state and the internal node (net A) is discharged to VSS electric potential. Thus, operation of an (n)-th gate bus line is completed. Thereafter, until an operation is again performed with the next frame, VSS electric potential is input into the gate bus line GL(n) through the TFT-d, in accordance with operation of CKB and a Low state is maintained.

Configuration of the gate driver according to the present embodiment is not limited to an example that is illustrated in FIG. 4. Various known gate drivers can find application in the present embodiment. Furthermore, instead of the gate driver, the source driver may be formed within a pixel.

FIG. 7(a) is a circuit diagram illustrating any other gate driver 210 according to the present embodiment. FIG. 7(b) is a diagram illustrating a signal waveform for driving the gate driver 210.

The gate driver 210 is provided between the gate bus line GL(n−1) and a gate bus line GL(n−2), and drives the gate bus line GL(n−1). The gate driver 210 has a TFT-A to a TFT-J that are circuit TFTs, the capacitor Cbst, multiple terminals through which a signal such as the clock signal is supplied, the terminal group through which the power source voltage signal at a low level is input. The first circuit TFT 10 that is illustrated in FIG. 4 is equivalent to, for example, the TFT-F in the gate driver 210.

The detailed structure and operation of the gate driver 210 is disclosed, for example, in International Publication No. 2014/069529. For reference, the entire contents of International Publication No. 2014/069529 are incorporated in the present specification by reference.

Second Embodiment

An active matrix substrate according to a second embodiment of the present invention will be described below with reference to the drawings. The semiconductor device according to the present embodiment is an active matrix substrate that includes an oxide semiconductor TFT and a crystalline silicon TFT that are formed on the same substrate.

The active matrix substrate according to the present embodiment includes the first circuit TFT that constitutes a pixel TFT and a drive circuit (for example, a gate driver), in the display area, and includes a second circuit TFT in the non-display area. The second circuit TFT is a circuit TFT that constitutes a peripheral circuit that is monolithically formed in the non-display area. This peripheral circuit may be a Source Shared Driving (SSD) circuit, an inspection circuit, a drive circuit (for example, a source driver), or the like.

The pixel TFT and the first circuit TFT are oxide semiconductor TFTs that are the same as described above in the embodiment. On the other hand, the second circuit TFT, for example, is a crystalline silicon TFT of which an active layer is a polycrystalline silicon film.

Figure 8:
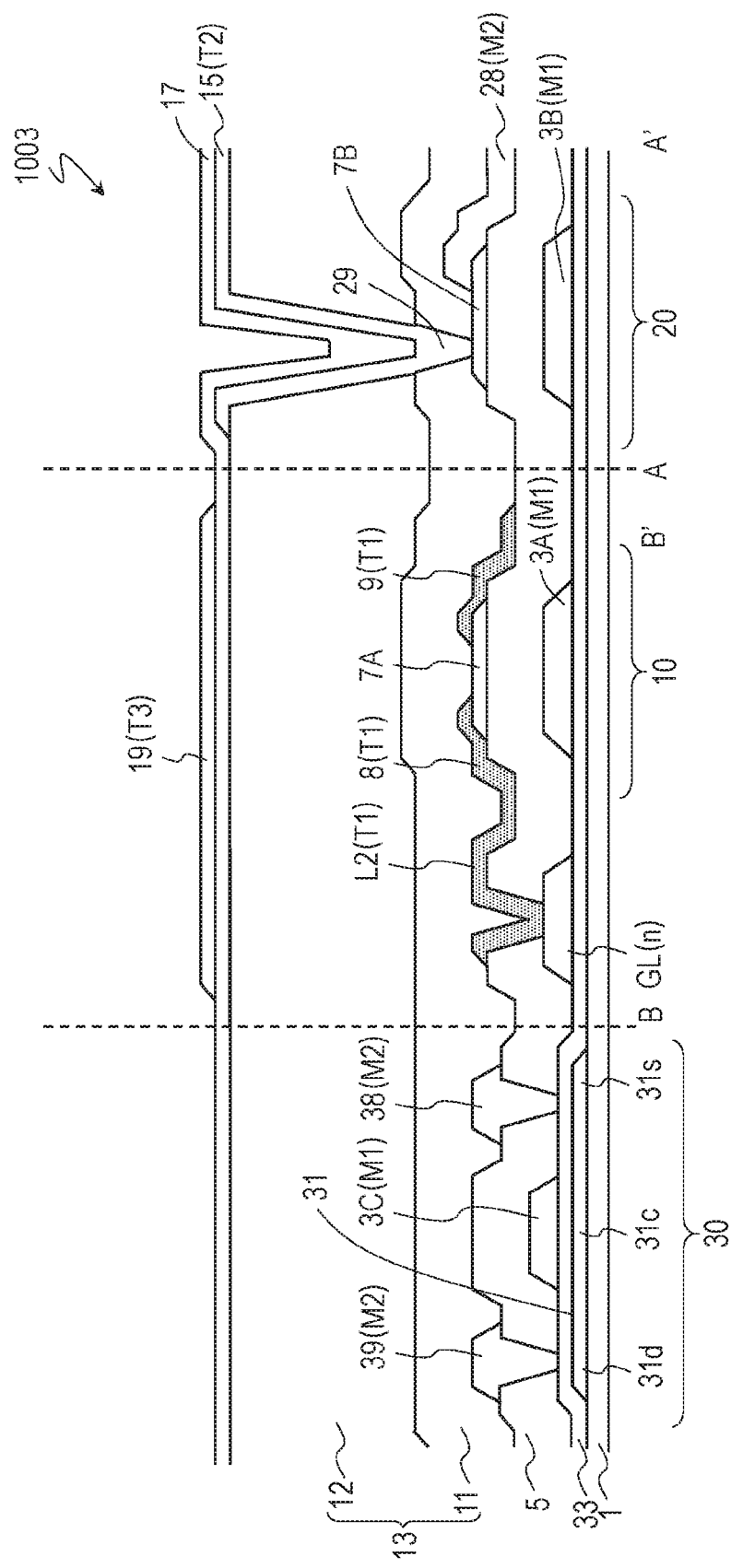
FIG. 8 is a cross-sectional diagram illustrating a pixel TFT, a first circuit TFT, and a second circuit TFT in an active matrix substrate 1003 according to the second embodiment.

FIG. 8 is a cross-sectional diagram illustrating the pixel TFT, the first circuit TFT, and the second circuit TFT in the active matrix substrate according to the present embodiment.

The active matrix substrate 1003 includes the substrate 1, the first circuit TFT 10 that is supported in the substrate 1, the pixel TFT 20, and a second circuit TFT 30. The second circuit TFT 30 is a crystalline silicon TFT that has an active region which primarily contains crystalline silicon. The first circuit TFT 10 and the pixel TFT 20 are oxide semiconductor TFTs each of which has an active region which primarily contains includes an oxide semiconductor. The "active region" here is assumed to refer to an area in which a channel is formed, of the semiconductor layer that is the active layer of the TFT.

Configurations of the first circuit TFT 10 and the pixel TFT 20 are the configurations that are described above with reference to FIG. 4.

The second circuit TFT 30 includes a crystalline silicon semiconductor layer (for example, a low temperature polysilicon layer) 31 that is formed on the substrate 1, an insulating layer (also referred to as "any other gate insulating layer") 33 that covers the crystalline silicon semiconductor layer 31, and a gate electrode 3C that is provided on the insulating layer 33. A portion that is positioned between the crystalline silicon semiconductor layer 31 and the gate electrode 3C, of the insulating layer 33 functions as a gate insulating film of the second circuit TFT 30. The crystalline silicon semiconductor layer 31 has a region (an active region) 31c on which a channel is formed and has a source region 31s and a drain region 31d that are positioned to both the sides, respectively, of the active region. In this example, a portion that overlaps the gate electrode 3C with the insulating layer 33 in between, of the crystalline silicon semiconductor layer 31 is the active region 31c. The second circuit TFT 30 further has a source electrode 38 and a drain electrode 39 that are connected to the source region 31*s* and the drain region 31*d*, respectively. The source and drain electrodes 38 and 39 are provided on an insulating film (here, the gate insulating layer 5) that covers the gate electrode 3C and the crystalline silicon semiconductor layer 31, and may be connected to the crystalline silicon semiconductor layer 31, within a contact hole that is formed in the gate insulating layer 5. In the same manner as the first circuit TFT 10 and the pixel TFT 20, the second circuit TFT 30 is covered with the inter-layer insulating layer 13 that includes the inorganic insulating layer 11 and the organic insulating layer 12.

In an example that is illustrated, the second circuit TFT 30 has a top gate structure in which the crystalline silicon semiconductor layer 31 is positioned between the gate electrode 3C and the substrate 1. On the other hand, the first circuit TFT 10 and the pixel TFT 20 have bottom gate structures, respectively, in which the gate electrodes 3A and 3B are arranged between the oxide semiconductor layers 7A and the substrate 1 and between the oxide semiconductor layers 7B and the substrate 1, respectively. By employing this structure, it is possible that the number of manufacturing processes or an increase in manufacturing cost is more effectively suppressed when two types of thin film transistors are integrally formed on the same substrate 1.

TFT structures of the first circuit TFT 10, the pixel TFT 20, and the second circuit TFT 30 are not limited to those described above. For example, the first circuit TFT 10, the pixel TFT 20, and the second circuit TFT 30 may have the same TFT structure. Alternatively, the second circuit TFT 30 may have the bottom gate structure, and the first circuit TFT 10 and the pixel TFT 20 may have the top gate structure. Furthermore, in the case of the bottom gate structure, in the same manner as in the first circuit TFT 10 and the pixel TFT 20, a channel etch type may be available and an etch stop type may be available.

The gate insulating layer 5 that is a gate insulating film of the first circuit TFT 10 and the pixel TFT 20 may extend up to an area in which the second circuit TFT 30 is formed and may function as an inter-layer insulating film that covers the gate electrode 3C and the crystalline silicon semiconductor layer 31 of the second circuit TFT 30. In a case where the inter-layer insulating film of the second circuit TFT 30 and the gate insulating films of the first circuit TFT 10 and the pixel TFT 20 are formed in this manner within the same layer (the gate insulating layer 5), the gate insulating layer 5 may have a multi-layered structure. For example, the gate insulating layer 5 may have a multi-layered structure in which a layer (for example, a silicon nitride layer) with a hydrogen donation property of possibly supplying hydrogen and a layer (for example, a silicon oxide layer) with an oxygen donation property of possibly supplying oxygen, which is positioned on the layer with the hydrogen donation property of possibly supplying hydrogen, are included.

In this example, the gate electrode 3C of the second circuit TFT 30 is formed within the same gate metal layer as the gate electrodes 3A and 3B and the gate bus line GL. Furthermore, the source electrode 38 and the drain electrode 39 of the second circuit TFT 30 is formed within the same source metal layer as the source electrode 28 of the pixel TFT 20 and the source bus line SL. Accordingly, the increase in the number of manufacturing processes and in the manufacturing cost can be suppressed.

Figure 9:
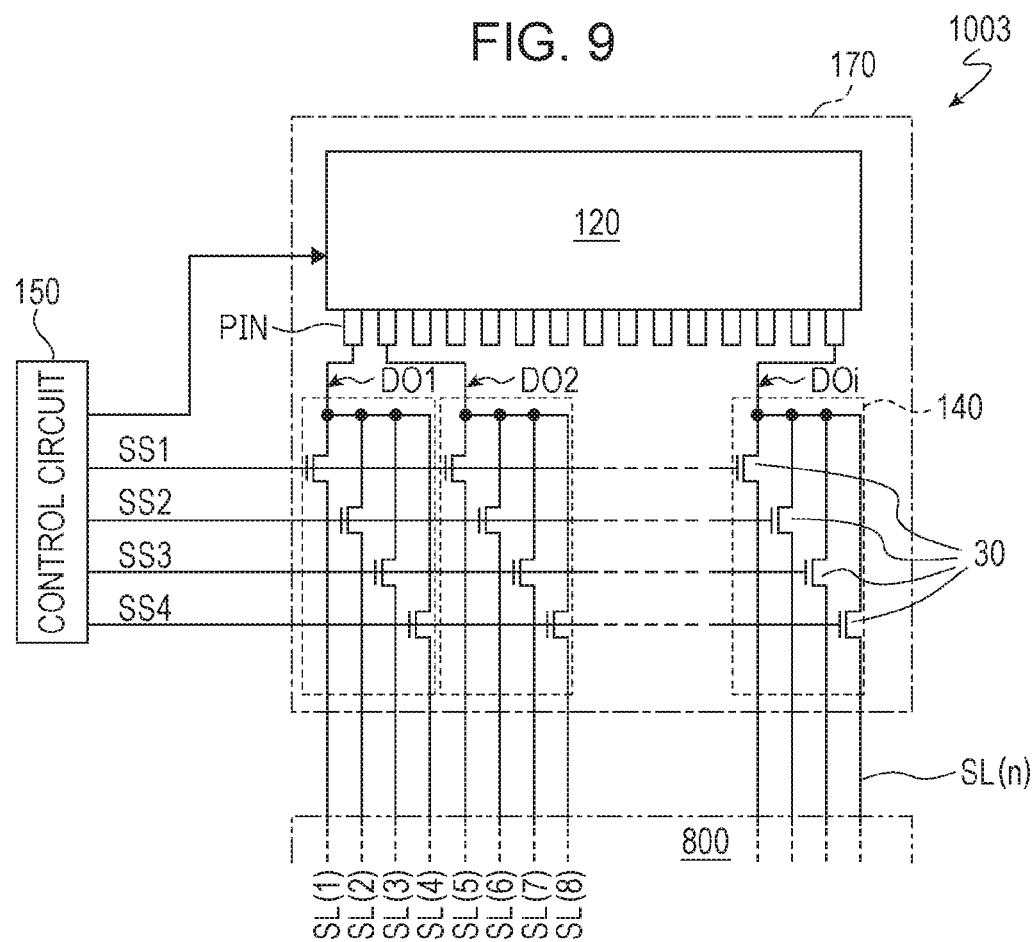
FIG. 9 is a plan-view diagram illustrating an SSD circuit 140 in the active matrix substrate 1003 according to the second embodiment.

FIG. 9 is a diagram for describing an example of the active matrix substrate 1003 according to the present embodiment.

The active matrix substrate 1003 further includes an SSD circuit 140 that is positioned in the non-display area 900. The SSD circuit 140 has multiple TFTs (peripheral circuit TFTs) that include the second circuit TFT 30. The second circuit TFT 30 is a crystalline silicon TFT that is described above with reference to FIG. 8.

The SSD circuit 140, for example, is positioned between a terminal portion 122 (FIG. 1) and the display area 800. The source driver 120 and the SSD circuit 140 are referred to as a source drive unit 170. The source drive unit 170 is controlled by a control circuit 150 that is provided in the non-display area 900.

Any one of the multiple output lines, output lines DO1 to DOi, is connected to each of the output pins PIN of the source driver 120. Multiple neighboring source bus lines (here, four neighboring data lines), a source bus lines SL(1) to a source bus line SL(4) are grouped, and thus a group of the source bus line SL(1) to the source bus line SL(4) is associated with one output line DO. The SSD circuit 140 is provided, as an output line unit, between the output line DO and the group of the source bus line SL(1) to the source bus line SL(4). In the SSD circuit 140, a TFT (hereinafter referred to as "SSD TFT") 30 as a selection switch is provided on each of the groups of the source bus line SL(1) to the source bus line SL(4). Any one of the selection signals SS1 to SS4 is supplied from the control circuit 150 to a gate electrode of the second circuit TFT 30. The selection signals SS1 to SS4 defines an ON duration of the selection switch within the same group, and is synchronized with a time-series signal output from the source driver 120. The SSD circuit 140 writes (performs time-division driving of) data electric potential that is obtained by time-dividing an output of the output line DO, to multiple source bus lines, the source bus line SL(1) to the source bus line SL(4) in a time-series manner. Accordingly, because a reduction in the number of output pins of the source driver 120 can be achieved, an increase in an area of the non-display area 900 can be further reduced (frame-narrowing).

It is noted that operation of a display device that uses each SSD circuit 140, a timing chart of time division driving, and the like, for example, are disclosed in Japanese Unexamined Patent Application Publication Nos. 2008-225036 and 2006-119404 and other publications. For reference, the entire contents of Japanese Unexamined Patent Application Publication Nos. 2008-225036 and 2006-119404 are incorporated in the present specification by reference.

According to the present embodiment, it is possible that, while a TFT having the transparent TFT structure is positioned within a pixel and thus a high pixel aperture ratio, the second circuit TFT 30 that possibly operates at a high speed is used in the SSD circuit 140.

The active matrix substrate 1003 can be manufactured as follows.

First, a base film (not illustrated) is formed, and a crystalline silicon film is formed on the substrate 1. The base film is not particularly limited, but, as the base film, for example, a multi-layered film of which a lower layer is a silicon nitride (SiNx) film and of which an upper layer is a silicon oxide (SiOx) layer may be formed. A crystalline silicon film can be formed by forming non-crystalline silicon (a-Si) and then crystallizing the resulting amorphous silicon. The formation of the a-Si film can be performed using a known method, for example, such as a Plasma Chemical Vapor Deposition (CVD) or a sputtering method. The crystallization of the a-Si film may be performed, for example, by illuminating the a-Si film with excimer laser light.

Next, patterning of the crystalline silicon film is performed, and an island-shaped crystalline silicon semiconductor layer (the thickness thereof, for example, is equal to or greater than 30 nm and is equal to or smaller than 70 nm) 31 is formed. Thereafter, a first insulating layer (the thickness thereof, for example, is equal to or greater than 50 nm and is equal to or smaller than 130 nm) 33 is formed in such a manner as to cover the crystalline silicon semiconductor layer 31. The insulating layer 33 is not particularly limited, but for example, primarily contains silicon oxide (SiOx). The insulating layer 33 also extends to the display area 800.

Subsequently, the gate metal layer M1 that includes the gate electrodes 3A, 3B, and 3C and the gate bus line GL is formed using the same method as in the active matrix substrate 1001.

Thereafter, impurities are implanted into the crystalline silicon semiconductor layer 31 as the gate electrode 3C as a mask, and the source region 31s and the drain region 31d are formed. An area into which the impurities are not implanted, of the crystalline silicon semiconductor layer 31 is the active region (the channel region) 31c.

Thereafter, formation of the gate insulating layer 5, the oxide semiconductor layers 7A and 7B, the first transparent conductive layer T1, the source metal layer M2, the interlayer insulating layer 13, the second transparent conductive layer T2, the dielectric layer 17, and the third transparent conductive layer T3 is formed in the same method as described above in the embodiment. However, in the present embodiment, before the formation of the source metal layer M2, an opening portion that extends to each of the source region 31s and the drain region 31d is provided in the gate insulating layer 5. Thereafter, a source metal film is formed within the gate insulating layer 5 and the opening portion, and patterning of the source metal film is performed. Accordingly, the source metal layer M2 that includes the source electrode 38, the drain electrode 39, the source electrode 28, and the source bus line SL is obtained. The other methods are the same as described above in the embodiment.

Third Embodiment

An active matrix substrate according to a third embodiment of the present invention will be described below with reference to the drawings. The semiconductor device according to the present embodiment is an active matrix substrate that includes an oxide semiconductor TFT and a crystalline silicon TFT that are formed on the same substrate.

A difference from the active matrix substrate 1003 according to the second embodiment is that in the present embodiment, at least a portion of the drive circuit wiring line L is formed using a crystalline silicon film that is the same as the crystalline silicon semiconductor layer 31. Specifically, the drive circuit wiring line L according to the present embodiment includes first and second metal portions that are formed from a gate metal film or a source metal film, and a connection portion that is formed from a crystalline silicon film and that electrically connects the first metal portion and the second metal portion.

Figure 10:
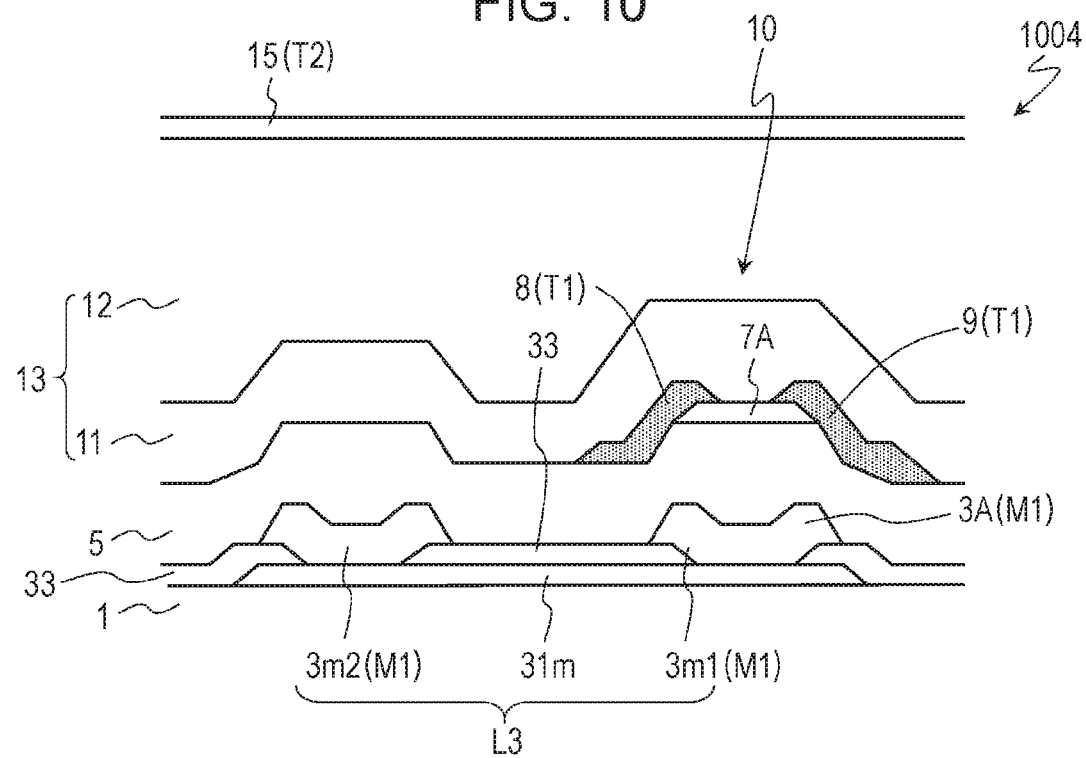
FIG. 10 is a cross-sectional diagram illustrating a portion of the gate driver 110 in an active matrix substrate 1004 according to a third embodiment.
Figure 12:
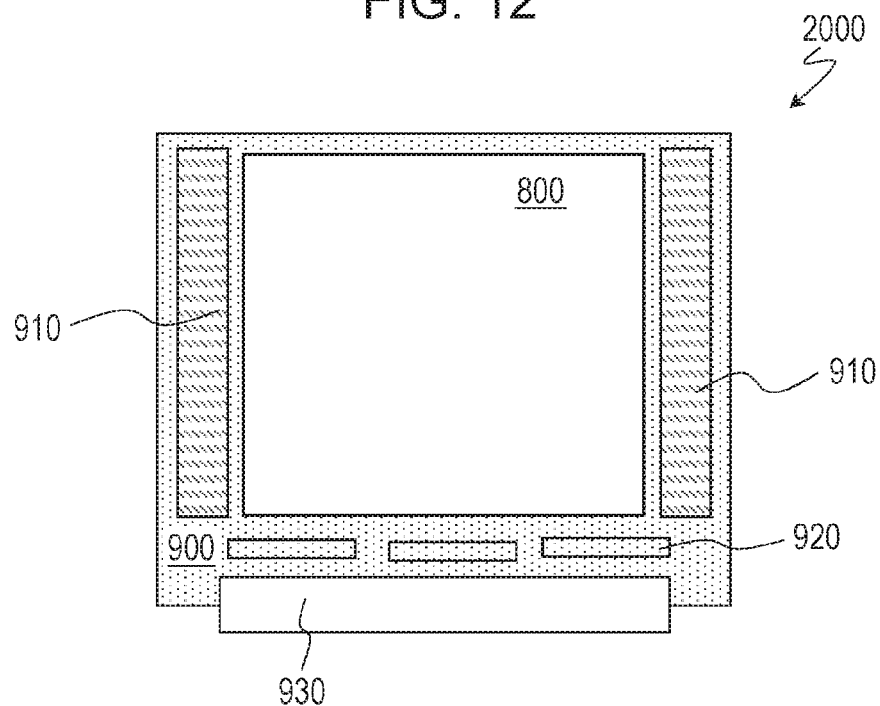
FIG. 12 is a plan-view diagram for describing an outline of an active matrix substrate 2000 in the related art, which includes a monolithic gate driver.

FIG. 10 is a cross-sectional diagram illustrating a portion of the gate driver 110 in an active matrix substrate 1004 according to the present embodiment. In FIG. 10, the first circuit TFT 10 and the third wiring line L3 that is connected to the gate electrode 3A of the first circuit TFT 10 are illustrated. In the following, a difference from the active matrix substrate 1003 that is illustrated in FIG. 8 is described in a focused manner, and descriptions that are the same as those of the active matrix substrate 1003 are omitted.

In the active matrix substrate 1004, the third wiring line L3 includes a portion that is formed within a gate metal layer, and a portion that is formed from a crystalline silicon film. In this example, the third wiring line L3 includes a first gate metal portion (a first metal portion) 3m1 and a second gate metal portion (a second metal portion) 3m2 that are arranged, separately from each other, within the gate metal layer, and a connection portion 31m that is formed from a crystalline silicon film. The first gate metal portion 3m1 may include the gate electrode 3A.

The connection portion 31m is an $n^-$ type, $n^+$ type, or $p^+$ type crystalline silicon layer that is obtained by implanting the impurities into crystalline silicon film. The connection portion 31m may be formed using the same impurity implantation process as the source region 31s or the drain region 31d of the second circuit TFT 20, and may contain the impurities at the same concentration as the source regions 31s and the drain region 31d.

The connection portion 31m electrically connects the first gate metal portion 3m1 and the second gate metal portion 3m2. Each of the first gate metal portion 3m1 and the second gate metal portion 3m2 may be connected directly to the connection portion 31m within the opening portion that is formed in the insulating layer 33.

According to the present embodiment, it is possible that, a portion of a drive circuit wiring line L that, in the related art, is formed from a metal film is formed from a crystalline silicon film that can transmit light, without adding a new transparent layer. Therefore, the pixel aperture ratio can be further improved without increasing the number of manufacturing processes.

Depending on an electric resistance value of the connection portion 31m, a width (a wiring line width) of the connection portion 31m may be greater than a width of the metal portion (for example, the second gate metal portion 3m2). Because the connection portion 31m can transmit light, although the width is increased, the light transmittance is not greatly decreased.

Furthermore, according to the present embodiment, by forming a portion of the drive circuit wiring line L from the crystalline silicon film, it is possible that the connection portion 31m of the drive circuit wiring line L and a circuit element such as the first circuit TFT 10 or any other wiring line portion are arranged in a manner that overlaps each other. Therefore, a circuit area can be further reduced.

Modification Example

FIG. 11(a) is a cross-sectional diagram illustrating any other active matrix substrate 1005 according to the present embodiment. FIG. 11(b) is an enlarged plan-view diagram illustrating a portion of the active matrix substrate 1005, and illustrates a portion of each of two pixel areas, pixel areas Pix1 and Pix2.

A TFT-F and a TFT-C that are illustrated in FIG. 7 are arranged, as circuit TFTs, in the pixel areas Pix1 and Pix2, respectively. The third wiring line L3 that is connected to the gate electrode 3A of the TFT-F extends up to any other pixel area Pix2 and is connected to a drain electrode of the TFT-C.

In the active matrix substrate 1005, a portion of the third wiring line L3 is formed from the crystalline silicon film. Specifically, the third wiring line L3 includes the first gate metal portion 3m1 that includes the gate electrode 3A, the connection portion 31m that is formed from a crystalline silicon film, the second gate metal portion 3m2, and a source metal portion 8*m* that is formed within a source metal layer. The first gate metal portion 3*m*1 (the first metal portion) is electrically connected to the source metal portion 8*m* (the second metal portion) through the connection portion 31*m* and the second gate metal portion 3*m*.

In this example, each of the first gate metal portion 3*m*1 and the second gate metal portion 3*m*2 is brought into contact with the connection portion 31*m* within an opening portion that is provided in the insulating layer 33. The source metal portion 8*m* is electrically connected to the connection portion 31*m* through the second gate metal portion 3*m*2 within an opening portion that is provided in the gate insulating layer 5. This connection portion 40 is referred to as "wiring line connection portion". In the wiring line connection portion 40, the source metal portion 8*m* may be connected directly to the connection portion 31*m* without the second gate metal portion 3*m*2 being formed.

A wiring line in which a wiring structure according to the present embodiment finds application is not limited to the third wiring line L3 that is illustrated in FIGS. 10 and 11. At least a portion of the drive circuit wiring line L that constitutes the gate driver 110 may be formed from the first and second metal portions, which are formed from the gate metal film or the source metal film, and from the crystalline silicon film, and may include a connection portion that electrically connects the first metal portion and the second metal portion.

In the active matrix substrate according to the present embodiment, although not illustrated, the first circuit TFT 10 may have a transparent TFT structure, without the first transparent conductive film being provided. Even in this case, a portion of the drive circuit wiring line L is formed from the crystalline silicon film, and thus the pixel aperture ratio can be increased.

<TFT Structure and Oxide Semiconductor>

The first circuit TFT 10 and the pixel TFT 20 according to the embodiments, which are described above, may have an etch stop structure in which an etch stop that covers the channel region is provided. As the etch stop layer, for example, an insulating layer, such as a $SiO_2$ layer, that contains oxygen, can be used. In a TFT that has the etch stop structure, channel side end portions of the source and drain electrodes, for example, are positioned on an etch stop layer. In order to form the etch stop type TFT, for example, the etch stop layer that covers a portion which is a channel region, of an upper surface of the semiconductor layer is formed, and then a conductive film for the source and drain electrodes is formed on the semiconductor layer and the etch stop layer and the separation for a source and a drain is performed.

The first circuit TFT 10 and the pixel TFT 20 according to the embodiments, which are described above, may have a top contact structure in which the source and drain electrodes are brought into contact with an upper surface of the semiconductor film, and may have a bottom contact structure in which the source and drain electrodes are brought into contact with a lower surface of the semiconductor layer. In the case of the bottom contact structure, in a process of patterning the semiconductor layer, the source and drain electrode may be formed using a conductive layer that is resistant to the etching liquid which is used for patterning of the semiconductor layer, in such a manner that the source and drain electrodes which are formed earlier than the semiconductor layer is not etched. In a case where oxalic acid is used as the etching liquid, the source and drain electrodes can be formed using polycrystalline metal oxide semiconductor film (for example, a poly ITO of or the like) that is resistant to the oxalic acid.

An oxide semiconductor that is included in the oxide semiconductor layers 7A and 7B may be an amorphous oxide semiconductor, and may be a crystalline oxide semiconductor that has a crystalline portion. As the crystalline oxide semiconductor, a polycrystalline oxide semiconductor, a micro-crystalline oxide semiconductor, a crystalline oxide semiconductor in which a c-axis aligns approximately vertically with a layer surface, or the like is given.

The oxide semiconductor layers 7A and 7B each may have a multi-layered structure in which two or more layers are involved. In a case where the oxide semiconductor layers 7A and 7B each have a multi-layered structure, the oxide semiconductor layers 7A and 7B each may include a non-crystalline oxide semiconductor layer and a crystalline oxide semiconductor layer. Alternatively, multiple crystalline oxide semiconductor layers that have different crystalline structures may be included. Furthermore, multiple non-crystalline oxide semiconductor layers may be included. In a case where the oxide semiconductor layers 7A and 7B each have a two-layered structure in which an upper layer and a lower layer are included, it is preferable that an energy gap of the oxide semiconductor that is included in the upper layer is greater than an energy gap of the oxide semiconductor that is included in the lower layer. However, in a case where a difference in the energy gap between the upper and lower layers is comparatively small, the energy gap of the oxide semiconductor in the lower layer may be greater than the energy gap of the oxide semiconductor in the upper layer.

Materials and structures of the non-crystalline oxide semiconductor and each of the crystalline oxide semiconductors described above, a film formation method, a structure of the oxide semiconductor layer that has a multi-layered structure, and the like, for example, are described in Japanese Unexamined Patent Application Publication No. 2014-007399. For reference, the entire contents of Japanese Unexamined Patent Application Publication No. 2014-007399 are incorporated in the present specification by reference.

The oxide semiconductor layers 7A and 7B each may include, for example, at least one type of metal element among In, Ga, and Zn. In the present embodiment, the oxide semiconductor layers 7A and 7B each contain, for example, an In—Ga—Zn—O-based semiconductor (for example, oxide indium gallium zinc). The In—Ga—Zn—O-based semiconductor here is a ternary oxide material that consists of Indium (In), Gallium (Ga), and Zinc (Zn). A ratio (a composition ratio) among In, Ga, and Zn is not particularly limited. Examples of the ratio include In:Ga:Zn=2:2:1, In:Ga:Zn=1:1:1, In:Ga:Zn=1:1:2, and the like. This oxide semiconductor layers 7A and 7B each can be formed from an oxide semiconductor film that contains an In—Ga—Zn—O-based semiconductor.

The In—Ga—Zn—O-based semiconductor may be amorphous and may be crystalline. A crystalline in-Ga—Zn—O-based semiconductor in which a c-axis aligns approximately vertically with a layer surface is preferable as a crystalline In—Ga—Zn—O-based semiconductor.

It is noted that a crystalline structure of the crystalline In—Ga—Zn—O-based semiconductor, for example, is disclosed in Japanese Unexamined Patent Application Publication Nos. 2014-007399, 2012-134475, and 2014-209727, which are described above, and other publications. For reference, the entire contents of Japanese Unexamined Patent Application Publication Nos. 2012-134475 and 2014-209727 are incorporated in the present specification by reference. A TFT that has an In-GA-Zn—O-based semiconductor layer has high mobility (which is more than 20 times higher than that of an a-Si TFT) and a small amount of leak electric current (which is less than one-hundredth of that of the a-Si TFT). Because of this, the TFT is suitably used as a drive TFT (for example, a TFT that is included in a drive circuit which is provided on the same substrate as a display area, in the vicinity of the display area that includes multiple pixels) and a pixel TFT (a TFT that is provided in a pixel).

The oxide semiconductor layers 7A and 7B may contain any other oxide semiconductor instead of the In—Ga—Zn—O-based semiconductor. For example, an In—Sn—Zn—O-based semiconductor (for example, $In_2O_3$—$SnO_2$—ZnO; InSnZnO) may be contained. The In—Sn—Zn—O-based semiconductor is a ternary oxide material that consists of Indium (In), Tin (Sn), and Zinc (Zn). Alternatively, the oxide semiconductor layers 7A and 7B each may contain an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, Cadmium oxide (CdO), a Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O-based semiconductor, or the like.

<Display Device>

The active matrix substrate according to the embodiments, which is described above, for ample, finds application in display devices. The display device may include an active matrix substrate, an opposite substrate that is positioned in such a manner as to face the active matrix substrate, and a display medium layer that is provided between the active matrix substrate and the opposite substrate. The display medium layer may be a liquid crystal layer or an organic EL layer.

The active matrix substrate can also find application in a liquid crystal display device that operates in a vertical alignment mode (VA mode), without being limited to a liquid crystal display device that operates in a transverse electric field mode such as an FFS mode or an In-Plane Switching (IPS) mode. Structures of these liquid crystal display devices are well known, and thus descriptions thereof are omitted.

INDUSTRIAL APPLICABILITY

The embodiments of the present invention can find wide application in display devices, such as liquid crystal display devices, organic electroluminescence (EL) display devices, and inorganic electroluminescence display devices, imaging devices, such as image sensor devices, and electronic devices, such as image input devices and fingerprint reading devices.

REFERENCE SIGNS LIST

1 SUBSTRATE
3A, 3B, 3C GATE ELECTRODE
5 GATE INSULATING LAYER
7A, 7B OXIDE SEMICONDUCTOR LAYER
8, 28, 38 SOURCE ELECTRODE
9, 29, 39 DRAIN ELECTRODE
11 INORGANIC INSULATING LAYER
12 ORGANIC INSULATING LAYER
13 INTER-LAYER INSULATING LAYER
15 PIXEL ELECTRODE
17 DIELECTRIC LAYER
19 COMMON ELECTRODE
31 CRYSTALLINE SILICON SEMICONDUCTOR LAYER
31c ACTIVE REGION
31d DRAIN REGION
31s SOURCE REGION
31m CONNECTION PORTION
33 ANY OTHER GATE INSULATING LAYER
40 WIRING LINE CONNECTION PORTION
110, 210 GATE DRIVER
120 SOURCE DRIVER
130 FPC SUBSTRATE
140 SSD CIRCUIT
800 DISPLAY AREA
900 NON-DISPLAY AREA
1001, 1002, 1003, 1004, 1005 ACTIVE MATRIX SUBSTRATE
GL GATE BUS LINE
SL SOURCE BUS LINE
L DRIVE CIRCUIT WIRING LINE
L1 FIRST WIRING LINE
L2 SECOND WIRING LINE
L3 THIRD WIRING LINE
Pix, Pix1, Pix2 PIXEL AREA
M1 GATE METAL LAYER
M2 SOURCE METAL LAYER
T1 FIRST TRANSPARENT CONDUCTIVE LAYER
T2 SECOND TRANSPARENT CONDUCTIVE LAYER
T3 THIRD TRANSPARENT CONDUCTIVE LAYER

The invention claimed is:

1. An active matrix substrate that has a display area which includes multiple pixel areas,
wherein the display area has
a substrate,
multiple gate bus lines that are formed from a first metal film on the substrate,
multiple source bus lines that are formed from a second metal film on the substrate, and
a drive circuit that is supported on the substrate,
wherein the drive circuit includes a first circuit TFT,
wherein each of the multiple pixel areas includes
a pixel TFT and
a pixel electrode that is connected to the pixel TFT,
wherein at least one of the multiple pixel areas further includes
the first circuit TFT and
a drive circuit wiring line that is connected to the first circuit TFT,
wherein each of the pixel TFT and the first circuit TFT is an oxide semiconductor TFT that includes
a gate electrode,
an oxide semiconductor layer,
a gate insulating layer that is positioned between the gate electrode and the oxide semiconductor layer, and
a source electrode and a drain electrode that are electrically connected to the oxide semiconductor layer,
wherein the drain electrode of the pixel TFT is electrically connected to the pixel electrode, the gate electrode of the pixel TFT is electrically connected to any one of the multiple gate bus lines, and the source electrode of the pixel TFT is electrically connected to any one of the multiple source bus lines,
wherein the pixel electrode is formed from an upper transparent conductive film,
wherein the drive circuit wiring line includes a transparent wiring line portion that is formed from a lower transparent conductive film which is positioned closer to the substrate than the upper transparent conductive film, and wherein at least one of the source electrode and the drain electrode of the first circuit TFT is formed from the lower transparent conductive film.

2. The active matrix substrate according to claim 1, wherein the source electrode of the pixel TFT is formed from the second metal film.

3. The active matrix substrate according to claim 1, wherein the source electrode of the pixel TFT is formed from the lower transparent conductive film.

4. The active matrix substrate according to claim 1, wherein the transparent wiring line portion includes the source electrode and the drain electrode of the first circuit TFT.

5. The active matrix substrate according to claim 1, wherein the drain electrode of the pixel TFT is formed in a manner that is integrally combined with the pixel electrode, using the upper transparent conductive film.

6. The active matrix substrate according to claim 1, wherein the multiple pixel areas are arranged in matrix form in a first direction and a second direction, and wherein the transparent wiring line portion of the drive circuit wiring line includes a portion that extends crossing the at least one pixel area in the first direction or the second direction.

7. The active matrix substrate according to claim 1, further comprising:
a non-display area that is positioned in the vicinity of the display area,
wherein the non-display area includes a peripheral circuit that is supported on the substrate,
wherein the peripheral circuit includes multiple peripheral circuit TFTs that include a second circuit TFT, and
wherein the second circuit TFT is a crystalline silicon TFT that includes
any other gate electrode,
a crystalline silicon semiconductor layer,
any other gate insulating layer that is positioned between the any other gate electrode and the crystalline silicon semiconductor layer, and
any other source electrode and any other drain electrode that are brought into contact with the crystalline silicon semiconductor layer.

8. The active matrix substrate according to claim 7, wherein the first circuit TFT and the pixel TFT each have a bottom gate structure, and the second circuit TFT has a top gate structure,
wherein any of the gate electrode of each of the first circuit TFT and the pixel TFT, and the any other gate electrode of the second circuit TFT is formed from the first metal film, and
wherein the crystalline silicon semiconductor layer of the second circuit TFT is closer to the substrate than the first metal film.

9. The active matrix substrate according to claim 7, wherein the drive circuit wiring line includes a connection portion that is formed from the same crystalline silicon film as the crystalline silicon semiconductor layer.

10. The active matrix substrate according to claim 9, wherein the drive circuit wiring line is formed from the first metal film or the second metal film and further includes a first metal portion and a second metal portion that are arranged separately from each other, and wherein the connection portion is electrically connected to the first metal portion and the second metal portion.

11. The active matrix substrate according to claim 1, wherein each of the multiple pixel areas further includes
a common electrode that is formed from any other transparent conductive film, and
a dielectric layer that is positioned between the common electrode and the pixel electrode.

12. The active matrix substrate according to claim 1, wherein the oxide semiconductor layer contains indium and tin.

13. The active matrix substrate according to claim 12, wherein the oxide semiconductor layer contains an In—Sn—Zn—O-based semiconductor.

14. The active matrix substrate according to claim 1, wherein the lower transparent conductive film is made of indium zinc oxide.

15. A method of manufacturing the active matrix substrate according to claim 1, the method comprising:
(a) a process of forming a first metal film on a substrate and of forming the multiple gate bus lines and the gate electrodes of the first circuit TFT and the pixel TFT by patterning the first metal film;
(b) a process of forming the gate insulating layer that covers the gate electrode of each of the first circuit TFT and the pixel TFT;
(c) a process of forming the oxide semiconductor layer of each of the first circuit TFT and the pixel TFT on the gate insulating layer;
(d) a process of forming a lower transparent conductive film on the oxide semiconductor layer and the gate insulating layer of the first circuit TFT and the pixel TFT, patterning the lower transparent conductive film, and thus forming the transparent wiring line portion that is brought into contact with the oxide semiconductor layer of the first circuit TFT; and
(e) a process of forming a second metal film on the oxide semiconductor layer and the gate insulating layer, patterning the second metal film, and thus forming the multiple source bus lines and the source electrode of the pixel TFT.

16. The method of manufacturing an active matrix substrate according to claim 15,
wherein the oxide semiconductor layer of each of the first circuit TFT and the pixel TFT includes an oxide semiconductor that contains indium and tin,
wherein the lower transparent conductive film contains indium tin oxide or indium zinc oxide, and
wherein, in the process (d), wet-etching of the lower transparent conductive film is performed with mixed acid containing phosphoric acid, nitric acid, and acetic acid as etching liquid.

17. An active matrix substrate that has a display area which includes multiple pixel areas, and a non-display area which is positioned in the vicinity of the display area,
wherein the display area has
a substrate,
multiple gate bus lines,
multiple source bus lines, and
a drive circuit that is supported on the substrate and includes a first circuit TFT,
wherein the non-display area includes a peripheral circuit that includes a second circuit TFT,
wherein each of the multiple pixel areas includes
a pixel TFT, and
a pixel electrode that is connected to the pixel TFT, wherein at least one of the multiple pixel areas further includes
the first circuit TFT and
a drive circuit wiring line that is connected to the first circuit TFT,
wherein each of the pixel TFT and the first circuit TFT is an oxide semiconductor TFT that has an oxide semiconductor layer as an active region,
wherein the second circuit TFT is a crystalline silicon TFT that has a crystalline silicon semiconductor layer as an active region, and
wherein at least a portion of the drive circuit wiring line is formed from the same crystalline silicon film as a crystalline silicon semiconductor layer.

* * * * *